United States Patent
Liu et al.

(10) Patent No.: US 10,423,745 B2
(45) Date of Patent: Sep. 24, 2019

(54) CORRECTION FOR FLARE EFFECTS IN LITHOGRAPHY SYSTEM

(71) Applicant: ASML NETHERLANDS B.V., Veldhoven (NL)

(72) Inventors: Hua-Yu Liu, Palo Alto, CA (US); Jiangwei Li, Palo Alto, CA (US); Luoqi Chen, Saratoga, CA (US); Wei Liu, Los Altos, CA (US); Jiong Jiang, Sunnyvale, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 14/537,441

(22) Filed: Nov. 10, 2014

(65) Prior Publication Data

US 2015/0058815 A1 Feb. 26, 2015

Related U.S. Application Data

(63) Continuation of application No. 13/823,685, filed as application No. PCT/EP2011/064390 on Sep. 1, 2011, now Pat. No. 8,887,104.

(Continued)

(51) Int. Cl.
*G06F 17/50* (2006.01)
*G03F 7/20* (2006.01)

(52) U.S. Cl.
CPC ......... *G06F 17/5045* (2013.01); *G03F 7/705* (2013.01); *G03F 7/70941* (2013.01); *G06F 17/5009* (2013.01)

(58) Field of Classification Search
CPC .. G03F 7/705; G03F 7/70941; G06F 17/5009; G06F 17/5045
(Continued)

(56) References Cited

U.S. PATENT DOCUMENTS 7,030,966 B2 4/2006 Hansen
7,199,863 B2 4/2007 Bruls et al.
(Continued)

FOREIGN PATENT DOCUMENTS

CN 1530755 9/2004
CN 101583909 11/2009
(Continued)

OTHER PUBLICATIONS

"Experimental validation of full-field extreme ultraviolet lithography flare and shadowing corrections", Journal of Vacumm Science and Technology: Part B, AVS/AIP, Melville, New York, US, vol. 16, No. 6, Dec. 2008 (Dec. 1, 2008).*
(Continued)

*Primary Examiner* — Nha T Nguyen
(74) *Attorney, Agent, or Firm* — Pillsbury Winthrop Shaw Pittman LLP

(57) ABSTRACT

A method for reducing an effect of flare produced by a lithographic apparatus for imaging a design layout onto a substrate is described. A flare map in an exposure field of the lithographic apparatus is simulated by mathematically combining a density map of the design layout at the exposure field with a point spread function (PSF), wherein system-specific effects on the flare map may be incorporated in the simulation. Location-dependent flare corrections for the design layout are calculated by using the determined flare map, thereby reducing the effect of flare.

24 Claims, 32 Drawing Sheets

Related U.S. Application Data

(60) Provisional application No. 61/403,383, filed on Sep. 14, 2010.

(58) Field of Classification Search
USPC .................................. 716/50–56; 430/5, 30
See application file for complete search history.

(56) References Cited

U.S. PATENT DOCUMENTS

| | | | |
|---|---|---|---|
| 7,541,603 B2 | 6/2009 | Van Herpen et al. | |
| 7,725,872 B2 | 5/2010 | Hsu et al. | |
| 8,443,311 B2 | 5/2013 | Arisawa et al. | |
| 2004/0156030 A1 | 8/2004 | Hansen | |
| 2005/0270523 A1 | 12/2005 | Wu et al. | |
| 2008/0074655 A1 | 3/2008 | Van Herpen et al. | |
| 2008/0229273 A1* | 9/2008 | Lorusso | B82Y 10/00 716/50 |
| 2009/0011345 A1* | 1/2009 | Tinnemans et al. | 430/30 |
| 2010/0002207 A1 | 1/2010 | Loopstra et al. | |
| 2010/0224790 A1* | 9/2010 | Platzgummer | B82Y 10/00 250/400 |
| 2010/0227261 A1 | 9/2010 | Shiraishi | |
| 2010/0258744 A1* | 10/2010 | Kim | B82Y 10/00 250/473.1 |
| 2010/0323282 A1* | 12/2010 | Uno | G03F 1/70 430/5 |
| 2011/0065027 A1* | 3/2011 | Inanami et al. | 430/5 |
| 2012/0198395 A1 | 8/2012 | Arisawa et al. | |
| 2012/0224156 A1 | 9/2012 | Lee et al. | |
| 2013/0159944 A1 | 6/2013 | Uno et al. | |

FOREIGN PATENT DOCUMENTS

| | | | |
|---|---|---|---|
| EP | 2 110 707 | * | 10/2009 |
| JP | 2007-524255 | | 8/2007 |
| JP | 2009-170839 | | 7/2009 |
| WO | 2008/139904 | | 11/2008 |

OTHER PUBLICATIONS

"Layout compensation for EUV flare using contemporary EDA software", @Nov. 3, 2004, F.M. Schellenberg, J. Word, O. Toublan, Mentor Graphic Corp, http://euvlsymposium.lbl.gov/pdf/2004/presentations/day2/Re06_Schellenberg.pdf.*

International Search Report and Written Opinion dated Nov. 21, 2011 in corresponding International Patent Application No. PCT/EP2011/064390.

Takashi Kamo et al., "Thin absorber EUV mask with light-shield border of etched multilayer and its lithographic performance," Proc. of SPIE, vol. 7748, pp. 774805-1-774805-10 (2010).

Yoonsuk Hyun et al., "Feasibility of EUVL thin absorber mask for minimization of mask shadowing effect," Proc. of SPIE, vol. 7636, pp. 763614-1-763614-11 (2010).

Hwan-Seok Seo et al., "Absorber stack optimization in EUVL masks: lithographic performances in alpha demo tool and other issues," Proc. of SPIE, vol. 7636, pp. 76360X-1-76360X-9 (2010).

Chang-Moon Lim et al., "Practical flare compensation strategy for DRAM device," Proc. of SPIE, vol. 7636, pp. 76362B-1-76362B-9 (2010).

E. L. Church et al., "The optimal estimation of finish parameters," SPIE, vol. 1530, Optical Scatter: Applications, Measurement, and Theory, pp. 71-85 (1991).

Eelco van Setten et al., "EUV mask stack optimization for enhanced imaging performance," Proc. of SPIE, vol. 7823, pp. 782310-1-782310-12 (Sep. 13, 2010).

Gian F. Lorusso et al., "Flare in extreme ultraviolet lithography: metrology, out-of-band radiation, fractal point-spread function, and flare map calibration," J. Micro/Nanolith. MEMS MOEMS, vol. 8, No. 4, pp. 041505-1-041505-6 (Oct.-Dec. 2009).

A.M. Myers et al., "Experimental validation of full-field extreme ultraviolet lithography flare and shadowing corrections," J. Vac. Sci. Technol., Part B, vol. 26, No. 6, pp. 2215-2219 (Nov./Dec. 2008).

* cited by examiner

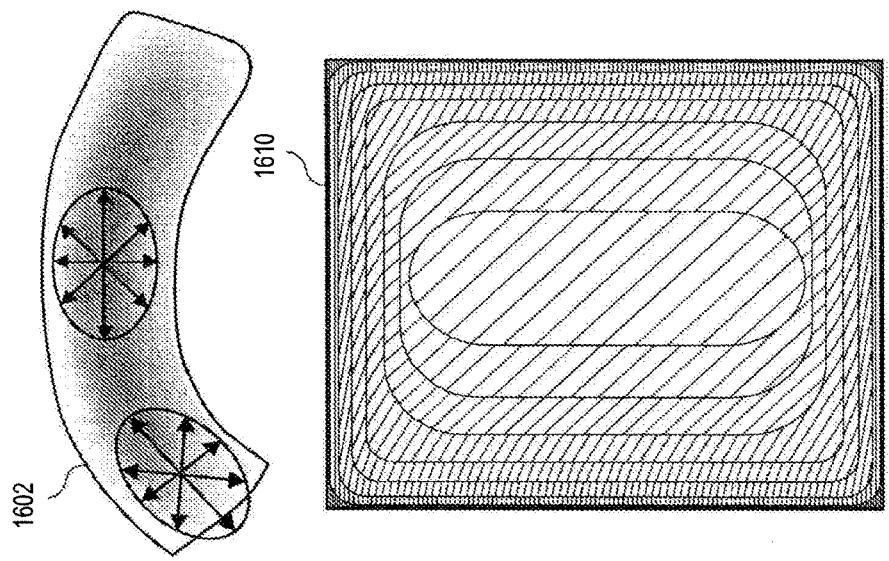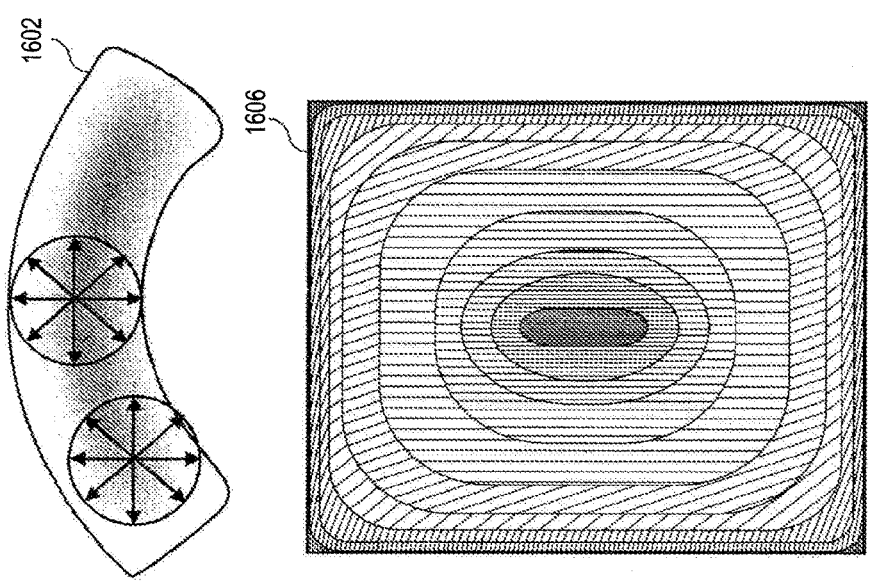
FIG. 16

CORRECTION FOR FLARE EFFECTS IN LITHOGRAPHY SYSTEM

CROSS-REFERENCE TO RELATED APPLICATIONS

This application is a continuation of U.S. patent application Ser. No. 13/823,685, filed Mar. 14, 2013, (now U.S. Pat. No. 8,887,104), which is the National Stage of International Patent Application of PCT/EP2011/064390, filed Sep. 1, 2011, which claims the benefit of U.S. Provisional Patent Application Ser. No. 61/403,383, filed Sep. 14, 2010, each of which is hereby incorporated by reference in its entirety.

FIELD OF THE INVENTION

The present invention relates generally to lithographic imaging, and more particularly to, correcting a design layout for manufacturing a mask where system-induced flare effects of a lithography apparatus are compensated.

BACKGROUND OF THE RELATED ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the wafer (via the mask).

A theoretical estimate of the limits of pattern printing can be given by the Rayleigh criterion for resolution as shown in equation (1):

$$CD = k_1 * \frac{\lambda}{NA} \quad (1)$$

where λ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength X, by increasing the numerical aperture NA or by decreasing the value of k1.

In general, the smaller the $k_1$, the more difficult it becomes to reproduce a pattern on the wafer that resembles the shape and dimensions planned by a circuit designer in order to achieve particular electrical functionality and performance. To overcome these difficulties, sophisticated fine-tuning steps are applied to the illumination source, the projection system as well as to the mask design. These include, for example, but not limited to, optimization of NA and optical coherence settings, customized illumination schemes, use of phase shifting masks, optical proximity correction (OPC) in the mask layout that may include use of sub-resolution assist features (SRAF), or other methods generally defined as 'resolution enhancement techniques' (RET). The RET techniques that may involve modifying the design layout, may be termed as 'optical enhancement features' (OEF).

As discussed above, in order to shorten the exposure wavelength and, thus, reduce the minimum printable size, it has been proposed to use a radiation source that has a wavelength in the deep ultra-violet (DUV) or extreme ultra-violet (EUV) regime. While DUV wavelength regime is already commercially utilized, EUV wavelength regime is fast becoming an attractive commercial technology for the obvious reason of even shorter wavelength compared to DUV regime. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring (especially for the x-ray wavelengths).

However, EUV lithography systems have some unique characteristics that need to be taken care of for lithographic simulation. Since EUV projection lithography systems need to rely on reflective optical elements and masks with a three-dimensional topology, as well as typically uses oblique illumination for image formation, some undesirable shadowing and flare effects arise in the lithographic process that needs to be overcome.

Flare is generally defined as the unwanted background light (i.e. noise) that is caused by scattering of light due to the roughness on the optical surfaces in the optical path. Flare degrades the image contrast at the image plane. Thus, it is desirable to reduce flare as much as possible.

The "aerial image with flare" is equal to the "aerial image without flare" convolved with a point-spread function (PSF) plus the scattering. The foregoing can be expressed as:

$$I_{flare}(x,y) = I_{noflare}(x,y) \otimes PSF + c_o I_{noflare}(x,y) \quad (2)$$

where $I_{flare}$ is the aerial image without flare, $I_{flare}$ is the aerial image with flare, and $c_o$ is a conservation normalization constant that ensures cons on of energy.

In addition to the negative effect on image contrast, flare is also unevenly distributed across the scanning slit and is not uniform with the exposure field, which can cause intra-field CD variation. Therefore, protecting features and reducing background stray light becomes increasingly critical. The issue of how to reduce or negate the effects of background stray light becomes even more important as the wavelengths of the exposure tools are reduced.

Currently, a flare map is generated from a target design layout in a computational lithography-based simulation model. A flare map defines the distribution of flare within an exposure field. The flare map is generated in order to calculate the correction terms that are needed to modify the target design layout into a modified design layout for the mask. However, there is still room to improve the accuracy and efficiency of flare map generation in computational lithography, where the flare map should comprehensively incorporate the effects of mask modification (such as, addition of flare reduction assist features and/or repositioning of feature edges in the design layout) necessary to counter the optical proximity effects and other possible lithography-system-specific effects, which may modify the flare distribution.

Therefore, it is desirable to improve the accuracy of the flare map modeling, especially in DUV and EUV systems where flare effects negatively impact the imaging advantages achieved by using shorter wavelengths. At the same time, it is desirable that the accuracy of flare map modeling be achieved in a computationally efficient manner, i.e. time and computing power required to generate a flare map should be at an acceptable level within the overall lithography processing system and timeframe.

SUMMARY OF THE INVENTION

The present invention relates to correction of flare effects in a lithographic apparatus. The flare effects are more pronounced in EUV lithography, though the scope of the present invention is not limited by the wavelength of a radiation source. For example, deep ultraviolet (DUV) lithography process can also be improved by the embodiments of the present invention. Moreover, typically, even in an EUV lithography system, remnant DUV radiations may be present and may affect flare distribution within the exposure field. The present invention discloses simulation methods that are inclusive of both EUV and DUV radiation. In an aspect of the present invention, a method for reducing an effect of flare produced by a lithographic apparatus for imaging a design layout onto a substrate is described. A flare map in an exposure field of the lithographic system is simulated by mathematically combining a density map of the design layout at the exposure field with a point spread function (PSF), wherein system-specific effects on the flare map are incorporated in the simulation. Location-dependent flare corrections for the design layout are calculated by using the determined flare map, thereby reducing the effect of flare. Some of the system-specific effects included in the simulation are: a flare effect due to reflection from black border of a mask, a flare effect due to reflection from one or more reticle-masking blades defining an exposure slit, a flare effect due to overscan, a flare effect due reflections from a gas-lock sub-aperture of a dynamic gas lock (DGL) mechanism, and a flare effect due to contribution from neighboring exposure fields.

In a further aspect of the present invention, the density map is crested from the design layout after being modified by optical enhancement features (OEF). Flare corrections are calculated for the post-OEF design layout.

In a further aspect of the present invention, the flare correction is done in two stages: the first stage corrects flare effects using known process parameters, and the second stage corrects the flare effects by using an improved flare map, as calculated by the method above.

In a further aspect of the present invention, a computer program product is disclosed, comprising a computer-readable medium having instructions recorded therein, which when executed, cause the computer to perform the flare correction methods mentioned above.

Furthermore, the flare correction method of the present invention is easily integrated into the current design flow, does not result in mask (reticle) manufacturability issues, and has minimum data volume impact.

The present invention further provides a methodology to reduce the impact of flare and produce better process latitude and provide CD control and improve device performance.

Additional advantages of the present invention will become apparent to those skilled in the art from the following detailed description of exemplary embodiments of the present invention. The invention itself, together with further objects and advantages, can be better understood by reference to the following detailed description and the accompanying drawings.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 16, 17A, 17B, 18A, 18B, 19A, 19B, 20A, and 20B show flare effects due to reflections from a gas-lock sub-aperture of the DGL, as simulated using the methods of the present invention.

DETAILED DESCRIPTION OF THE PREFERRED EMBODIMENTS

1. Overview

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including, but not limited to, EUV (extreme ultra-violet radiation, e.g. having a wavelength in the range 5-20 nm).

Figure 11:
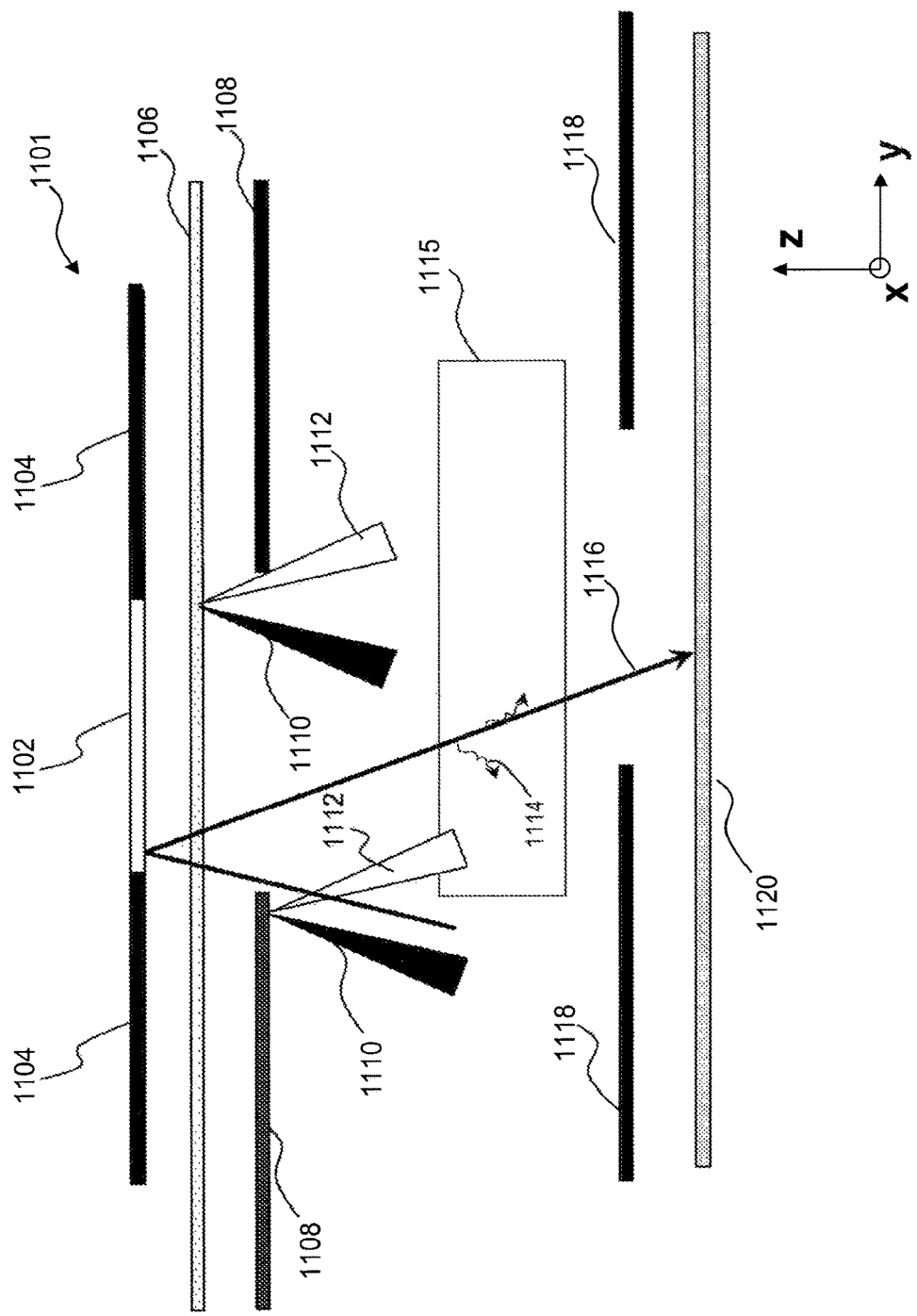
FIG. 11 schematically shows a portion of a lithography system showing the sources of system-specific flare effects described in the present invention.
Figure 12:
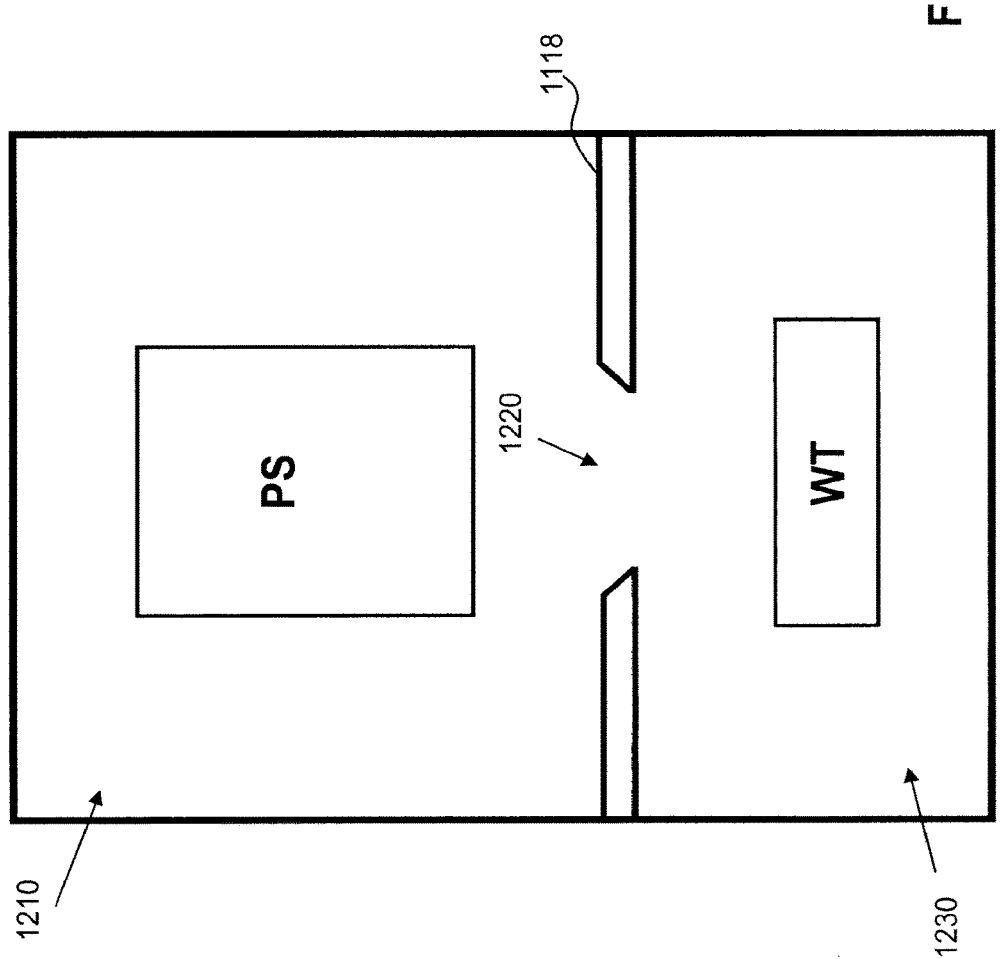
FIG. 12 shows a Dynamic Gas Lock (DGL) mechanism, according to an embodiment of the present invention, where reflections from a gas-lock sub-aperture of the DGL mechanism is a source of additional flare effects.

Also, in the context of the present invention, the term "Optical Enhancement Features" (OEF) encompasses both optical proximity correction (OPC) and sub-resolution assist features (SRAFs) placed in a modified design layout for the mask to enhance print fidelity of sub-resolution features. As will be explained further below, post-OEF modified design layout for the mask may be further modified for correcting flare and/or shadow effects. The present invention emphasizes on compensating for the flare effects. In some embodiments, shadow effects and flare effects are taken into account in a unified lithographic simulation model, while in other embodiments, flare effects are corrected separately, and shadow effects can be compensated using known techniques after or before the flare correction. Shadow effects may be included in the term "system-specific effects" or "machine-specific effects", but in general, this particular invention emphasizes on system-specific flare effects that are caused by factors including, but not limited to, reflection from a border of a mask (referred to as 'black border'), reflection from reticle masking blades (ReMa blades) that define an exposure slit within an exposure field, reflection from a gas-lock sub-aperture of the dynamic gas lock (DGL), field overscan, contribution from neighboring fields, etc. These factors are typically not built into the EUV system model (such as 810, 910 and 1010, in FIGS. 8, 9, and 10, respectively), though in certain embodiments it is possible to integrate the system-specific effects into the EUV system model. FIGS. 11 and 12 schematically show some of the sources of system-specific flare effects. It is noted that some of the above system-specific effects are applicable for an 'isolated' exposure field also, where there is no neighboring field is present. For example, reflections from ReMa blades, DGL gas-lock sub-aperture and black border, and overscan effect can be applicable for isolated field. Flare due to reflections from ReMa blades and black border, and flare due to overscan can be collectively called "field edge effects." When neighboring fields are present, inter-field effect is also a factor contributing to flare effect within a specific field of exposure. In other words, field-edge effects can be further enhanced due to the presence of neighboring fields when subsequent fields are scanned using sequential exposures to cover the entire wafer. Also, field edge effect may arise from the exposure slit scanning different locations within an isolated field.

2. General Environment in a Lithographic System for Implementing Example Embodiments of the Present Invention A. Example Lithography Tool This section discusses an example lithography tool, specifically an example EUV lithography tool.

Figure 1:
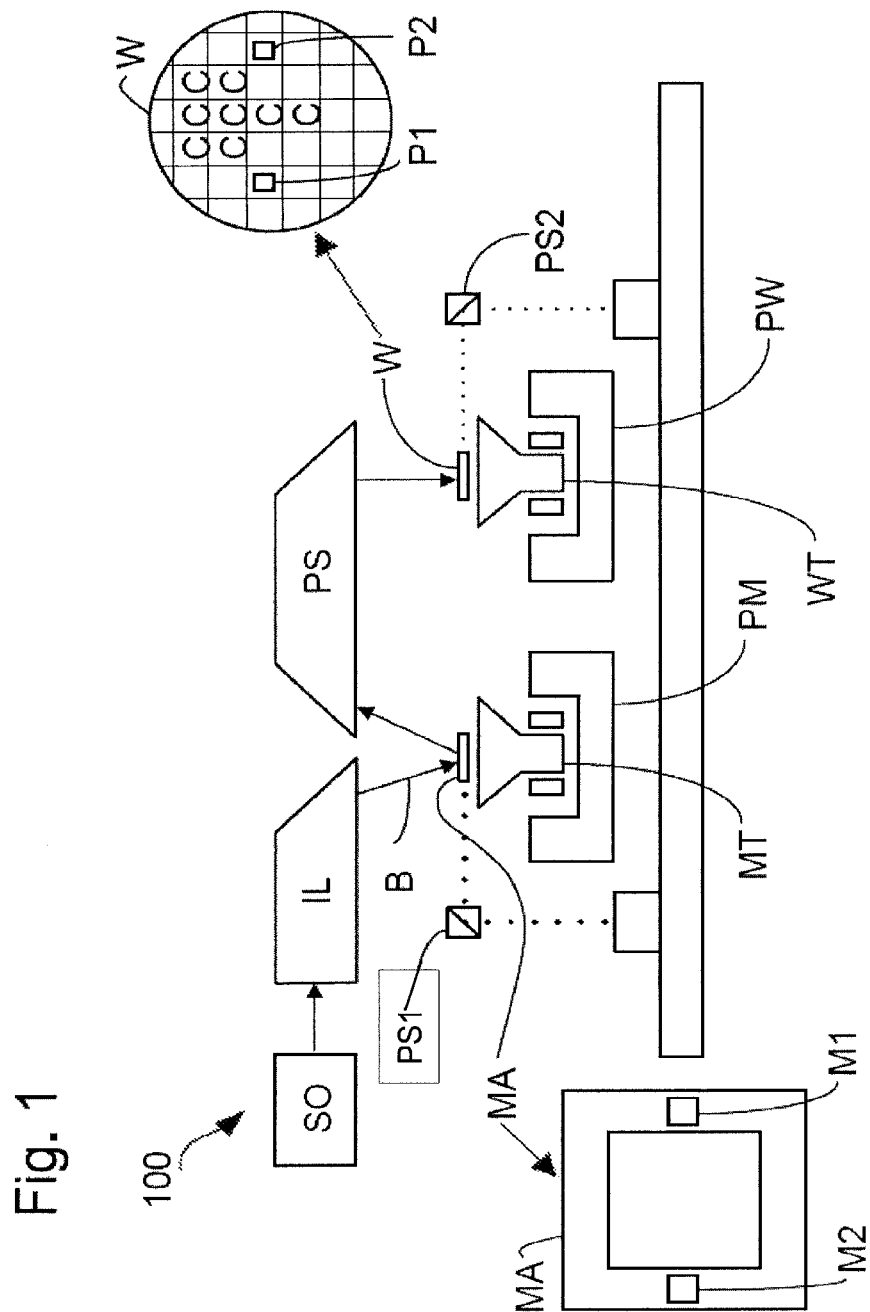
FIG. 1 depicts a lithographic apparatus according to an embodiment of the invention.

FIG. 1 schematically depicts a lithographic apparatus 100 including a source collector module SO according to one embodiment of the invention. The apparatus comprises:
- an illumination system (illuminator) IL configured to condition a radiation beam B (e.g. EUV radiation).
- a support structure (e.g. a mask table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist-coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". The term "lens", where the context allows, may refer to any one or combination of various types of optical components, including refractive, reflective, magnetic, electromagnetic and electrostatic optical components. Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The projection system and the illumination system may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since gases may absorb too much radiation. A vacuum environment may therefore be provided to the whole beam path with the aid of a vacuum wall and vacuum pumps.

As here depicted, the apparatus is of a reflective type (e.g. employing a reflective mask). It is to be noted that because most materials are absorptive within the EUV wavelength range, the mask may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the mask topography (e.g., a TaN absorber on top of the multi-layer reflector) defines where features would print (positive resist) or not print (negative resist).

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-) magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
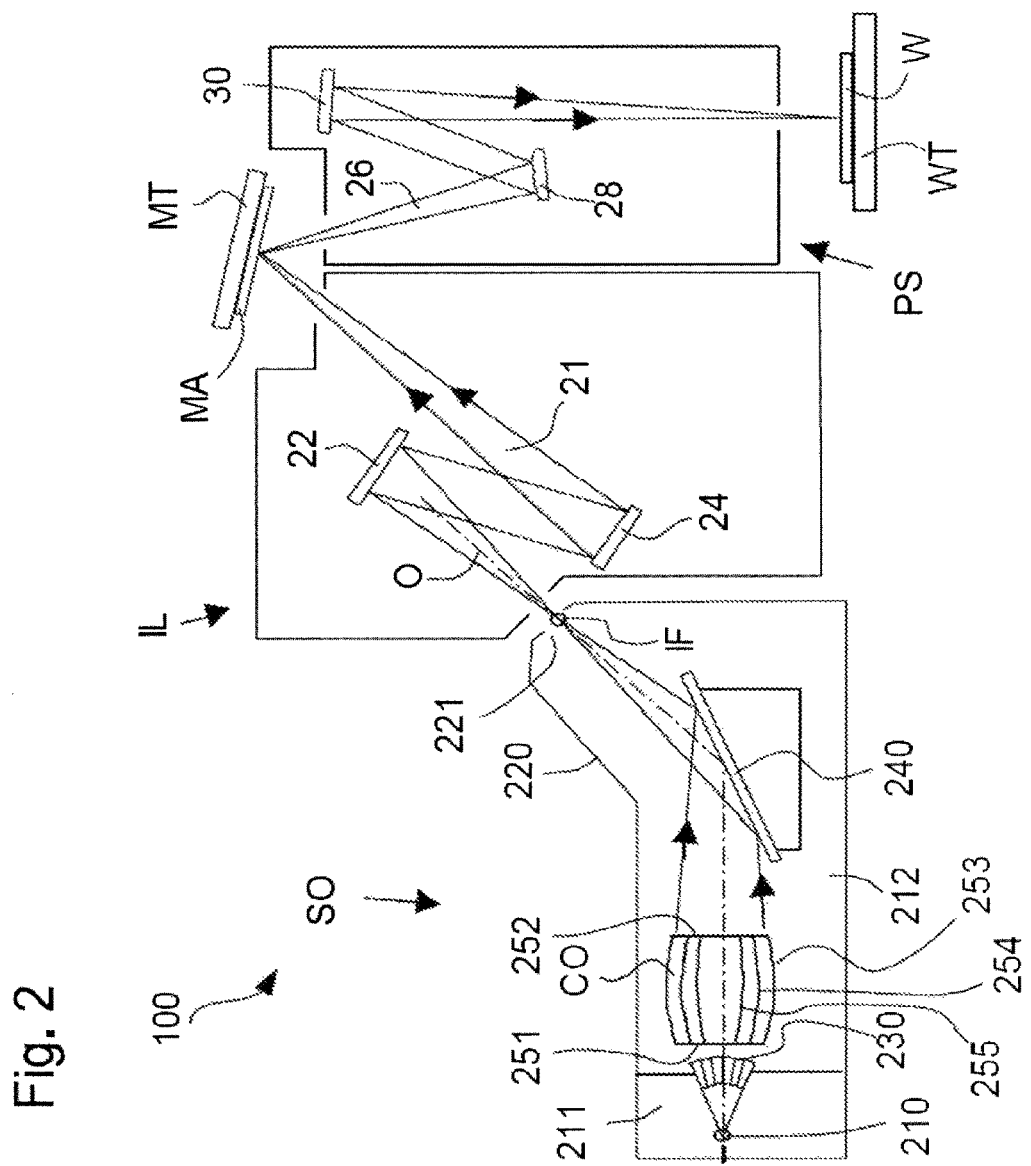
FIG. 2 is a more detailed view of the apparatus 100.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is preferably used in combination with a discharge produced plasma source, often called a DPP source.

Figure 3:
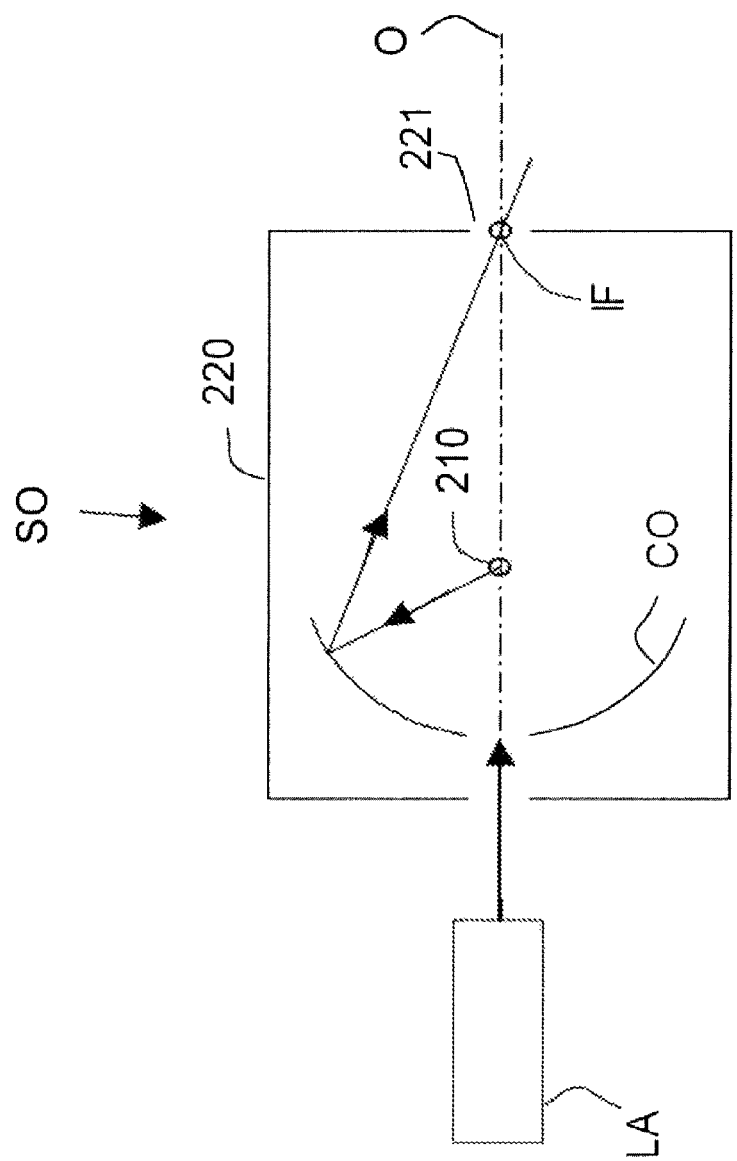
FIG. 3 is a more detailed view of the source collector module SO of the apparatus of FIGS. 1 and 2.

Alternatively, the source collector module SO may be part of an LPP radiation system as shown in FIG. 3. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. The descriptions above are intended to be illustrative, not limiting. Thus it will be apparent to one skilled in the art that modifications may be made to the invention as described without departing from the scope of the claims set out below. Further specific structural components of an EUV lithography system that contribute specifically to system-specific flare effects have been discussed later with reference to FIGS. 11 and 12.

B. Example General Lithographic Simulation Environment

This section briefly discusses the overall design and imaging process that involves computational lithographic simulation. The concepts disclosed herein may simulate or mathematically model any generic imaging system for imaging sub-wavelength features, and may be especially useful with emerging imaging technologies capable of producing wavelengths of an increasingly smaller size, including the EUV wavelengths.

Figure 4:
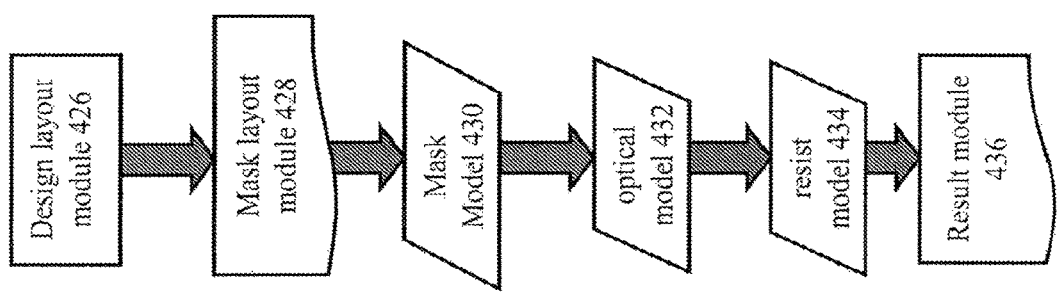
FIG. 4 is an exemplary block diagram illustrating the functional modules of a lithographic simulation model.

In a lithography simulation system, the major system components can be described by separate functional modules, for example, as illustrated in FIG. 4. Referring to FIG. 4, the functional modules include the design layout module 426, which defines the target design having various target patterns; the mask layout module 428, which defines the mask to be utilized in the imaging process; the mask model module 430, which defines the model of the mask layout to be utilized during the simulation process; the optical model module 432, which defines the performance of the optical components of lithography system; and the resist model module 434, which defines the performance of the resist being utilized in the given process. As is known, the result of the simulation process produces, for example, predicted contours and CDs in the result module 436.

More specifically, it is noted that the properties of the illumination and projection optics are captured in the optical model 432 that includes, but not limited to, NA-sigma ($\sigma$) settings as well as any particular illumination source shape (e.g. off-axis light sources such as annular, quadrupole, and dipole, etc.). The optical properties of the photo-resist layer coated on a substrate—i.e. refractive index, film thickness, propagation and polarization effects—may also be captured as part of the optical model 432. The mask model 430 captures the design features of the reticle and may also include a representation of detailed physical properties of the mask. For example, in EUV reflective mask, the mask model may take into account the characteristics of the multi-stack reflectors, the absorbing patterns, and other materials in the mask. Finally, the resist model 434 describes the effects of chemical processes which occur during resist exposure, post-exposure bake (PEB) and development, in order to predict, for example, contours of resist features formed on the substrate wafer. The objective of the simulation is to accurately predict, for example, edge placements and CDs, which can then be compared against the target design. The target design is generally defined as the pre-OPC or pre-optical-enhancement-feature (pre-OEF) mask layout, and will be provided in a standardized digital file format such as GDSII or OASIS.

A target design layout for which a lithographic process is to be optimized may include memory, test patterns and logic. In one embodiment, it is possible to identify an initial set of target patterns (clips) from this design layout in order to reduce computational burden. In a specific example, a full set of clips is extracted, which represents all the complicated patterns in the design layout (typically about 50 to 1000 clips, although any number of clips may be used). As will be appreciated by those skilled in the art, these patterns or clips represent small portions (i.e. circuits, cells or patterns) of the design and especially the clips represent small portions for which particular attention and/or verification is needed. However, for the most part, in the present invention, it has been assumed that a full mask layout (i.e., the mask design layout within a full exposure field) has been used for flare correction, rather than using some representative clips.

3. Example Methods and Embodiments of the Present Invention

In a typical high-end design almost every feature edge requires some modification in order to achieve printed patterns that come sufficiently close to the target design layout. These modifications may include shifting or biasing of edge positions or line widths as well as application of 'assist' features that are not intended to print themselves, but will affect the properties of an associated primary feature. Furthermore, optimization techniques applied to the source of illumination may have different effects on different edges and features. Optimization of illumination sources can include the use of pupils to restrict source illumination to a selected pattern of light. The optimized source is then used to optimize the mask (e.g. using OEF and LMC). The present invention provides extension of the lithographic modeling by incorporating flare corrections into the design layout modifications.

Figure 5:
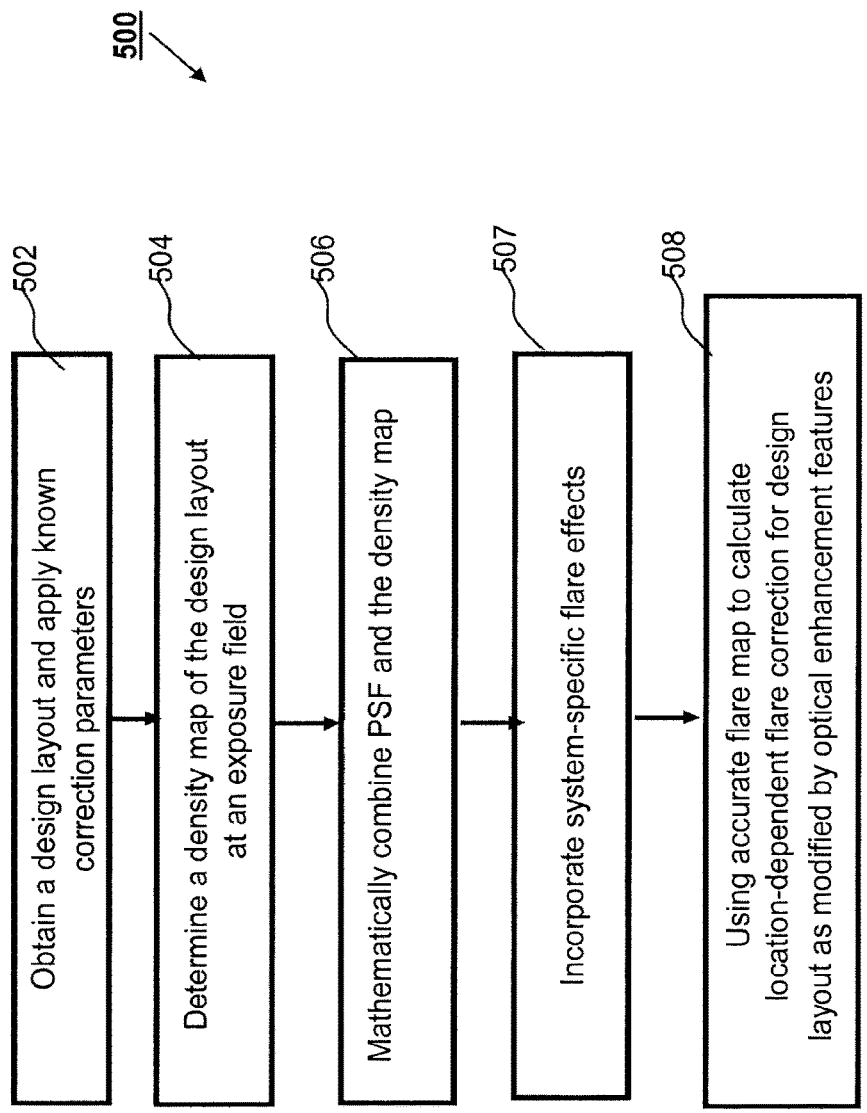
FIG. 5 shows a flowchart describing key steps of a two-stage flare correction method, according to an embodiment of the present invention.

Flowchart 500 in FIG. 5 is an exemplary flowchart illustrating some key steps of a method of flare correction, in accordance with an embodiment of the present invention. Persons skilled in the art will appreciate that the method shown in FIG. 5 only depicts illustrative steps. Not all the steps need to be included in every embodiment, and additional intermediate/terminal steps may be included in the methods, as applicable. The sequence of the steps may be altered.

In step 502, a design layout is obtained. This design layout is the pre-OEF layout. In conventional methods of flare correction, which may be referred to as a one-stage method of flare map generation, a flare map is generated from this pre-OEF design layout without applying a reference flare value. In the present invention, a multi-stage correction approach is adopted. In a first stage (stage 1), shown in step 502, the design layout is modified applying known correction parameters, which may include applying OEFs, and/or a reference flare value that may be known from previous experience. The lithography machine may be calibrated for post-OEF and/or post-reference flare-correction design layout. Therefore, in the first stage, a flare map is generated to adapt to a calibrated lithography machine. Though only two stages are shown in the examples discussed in the present application, any number of stages can be used for generating an accurate flare map.

The reference flare value that may be used in step 502 may be a reference flare value across the exposure field. For example, it may be known that for a specific lithography tool and a specific target pattern, an average flare value of x % (x can be any number) may be a reasonable estimate, and is applied to modify the design layout. OEF modification of design layout may comprise applying a known bias to the features of the design layout (i.e. moving an edge segment of a feature by a known translational amount) based on prior experience, or applying OEFs as predicted by optical simulation (described further in FIGS. 9 and 10). One example of applying a known bias is a constant horizontal-vertical (H-V) bias applied to overcome shadow effects resulting from the EUV mask topology. Both OEF and reference flare correction may be done in stage 1, or only one of them may be done in stage 1. The final correction of the design layout for the mask is done in stage 2. The more correction is incorporated in stage 1, the better the accuracy of the intermediate flare map that is used to calculate the location-dependent correction terms that are used to modify the design layout. However, there may be a trade-off between accuracy and computational load, and the simulators may decide which type of correction to be incorporated in stage 1 and stage 2. Additionally, persons skilled in the art will appreciate that the present invention is not limited by whether one or more known correction parameters are applied in step 502. The present invention works with the unmodified original design layout as well (akin to the conventional process of flare map generation, shown in FIG.

8), where all the design layout modifications are dealt with only in the subsequent stage, and none in the first stage.

In step 504, a density map is created from the design layout. Density map is a representation of the design layout at an exposure field. Density map can be created from the original target design layout, or the design layout modified by the OEFs and/or reference flare correction terms applied in stage 1, as described in step 502. Persons skilled in the art will understand that in equation (2), the term $I_{noflare}$ can be replaced by the density map. To reduce computation, density map may be created by rearranging the design layout (original or modified with OEF and/or reference flare value) on a relatively coarse grid, e.g. on a 0.5 μm grid, rather than a much finer grid used to generate OEFs. It may be also noted that in the second stage, a much finer grid is used to generate post-OEF aerial map or post-OEF design layout to calculate the correction terms.

In step 506, the density map and the PSF are mathematically combined. Flare map is typically derived as a convolution of PSF and the density map. This requires astronomical amount of computational time, because PSF in EUV has a very long tail that could even reach around several tens of thousands micron range. Therefore various computation optimization techniques are applied to simplify flare modeling without compromising the accuracy of the flare map. For example, longer tail part of PSF can be approximated with fixed DC flare level dependent on a saturated pattern density, and a short range PSF is used to substitute the long-tailed PSF.

In step 507, system specific flare effects are incorporated to generate a flare map. It is to be noted that though step 506 and 507 are shown as two different steps, they may be a single step, and the sequence of operations in steps 506 and 507 may be interchanged. For example, system-specific effects may be incorporated to change the PSF itself before convolution operation. Various possibilities of introducing the system-specific flare effects are discussed with respect to FIGS. 9 and 10. The flare map created via steps 506 and 507 is an improvement over the flare map created from an original design layout (as in prior arts) because of at least one of the following reasons: (1) in step 502, some improvements have already been introduced in the form of incorporating OEF corrections and/or reference flare correction; and (2) in steps 506 and 507, the flare map is further improved by incorporating EUV system-specific effects that may vary depending on the location of the particular exposure field.

Persons skilled in the art will appreciate that PSF can be of any form, such as a mathematical function, or a data table format. The mathematical form may be of a spectral form in the spatial frequency domain. PSF is also referred to in the spatial frequency domain as power spectral density (PSD). Co-owned issued U.S. Pat. No. 7,199,863 to Bruls et al. describes some mathematical details about PSD. In the data table format version of the PSF, local amplitude of PSF is tabulated against distances from a reference location in the image plane. In general, the resultant flare map generated after applying steps 506 and step 507 is referred to as an accurate flare map. It is to be noted that one additional goal of the present invention is to generate the accurate flare map using techniques that accelerates the runtime for flare map generation. One of those techniques that starts with using a single chip design layout, is described later in details with reference to FIG. 10.

In step 508, which is the so-called stage 2 (or a stage subsequent to any previous stages) of the present multi-stage implementation of flare correction, the accurate flare map from step 506 is used to calculate location-dependent flare correction for the design layout as modified by known correction parameters. In step 508, a post-OEF design layout may be used as a reference layout to which the correction terms are applied. In other words, known correction parameters already included in the reference design layout comprise OEFs predicted by a full-fledged optical simulation model. The reference flare correction may also be incorporated into the post-OEF reference design layout. Additional corrections that are needed are flare correction terms that are calculated from the accurate flare map. It is to be noted that in one embodiment, it is possible to use an unmodified PSF in earlier step 506, and introduce system-specific flare effect correction solely in the final stage 508 as a post-correction technique, i.e. step 507 occurs after other corrections are done in step 508.

Figure 6:
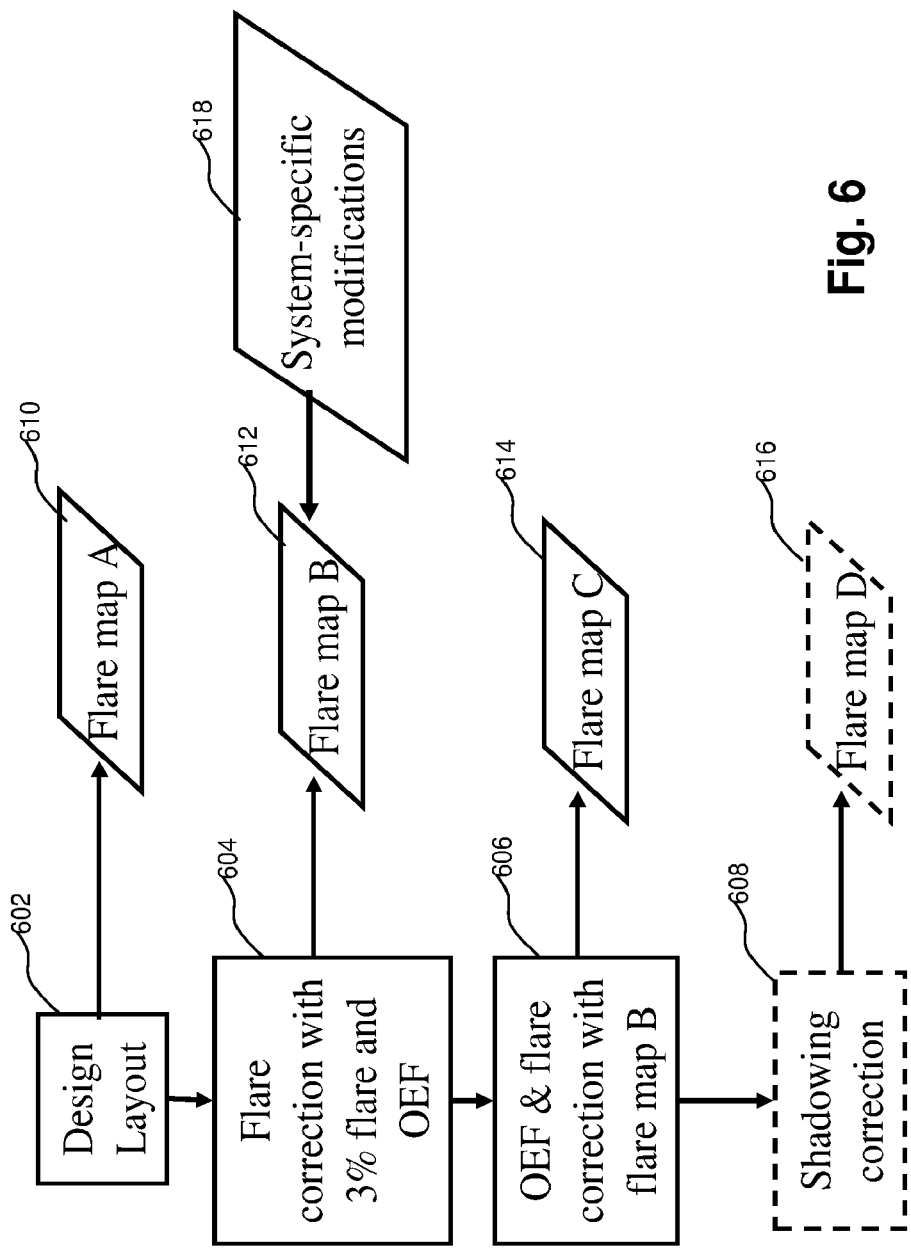
FIG. 6 shows example flare difference at various stages of flare correction flow, according to a specific embodiment of the present invention.

FIG. 6 shows one illustrative example of how accuracy of flare map generation can be progressively improved by incorporating appropriate corrections. In FIG. 6. blocks 602, 604, 606, and 608 indicate correction flow, while blocks 610, 612, 614, and 616 indicate example flare differences. Flare map A (block 610) is derived from the original target design layout (block 602), as is done in a prior art. Flare map B (block 612) is generated by applying a 3% average flare and OEF to the original design layout in stage 1 (clock 604), according to an embodiment of the present invention. Additionally, flare map B (block 612) can be further improved by incorporating the system-specific effects into the flare map (block 618). For example, system specific effects may be taken into account in the PSF itself (see FIG. 15). In alternative embodiments, PSF itself is not modified, but after convolving the density map with an unmodified PSF, an intermediate density map is generated, and that intermediate density map is further improved by introducing the system-specific effects. Flare map C (block 614) is generated in stage 2 after further correcting the design layout with the correction terms calculated from flare map B. This step is indicated as block 606. Persons skilled in the art will appreciate that it is not necessary to generate each of the maps A, B, and C as an output. Flare map generation may be an intermediate computational step that is used to calculate the correction terms that are applied to the design layout to manufacture a mask. It is seen that the flare intensity difference between flare map A and flare map C can be close to 1%. This difference is likely to be more when system-specific effects are incorporated in the generation of flare map B. Therefore, it can be said that flare map B and flare map C are progressively accurate representations of flare distribution within the exposure field. The intensity difference between flare map B and flare map C is indicative that the accuracy of flare map modeling can be increased by using an improved flare map B than using an average flare value from previous experience, even if OEF is applied to both stage 1 and stage 2. Finally, although not specifically covered in this invention, persons skilled in the art will appreciate that the accuracy of flare distribution can be further improved by incorporating shadowing corrections (block 608) into the optical modeling, that may result in flare map D (block 616), shown within dotted lines. Using a demonstration version lithography tool referred to as Alpha Demonstration Tool (ADT), it is shown that a 1% flare intensity difference translates to about 1.3 nm bias in the pattern feature edge. In other words, a bias of 1.3 nm should be applied to a pattern feature to compensate for the effect of 1% additional flare. This is a measure of flare sensitivity.

Figure 7:
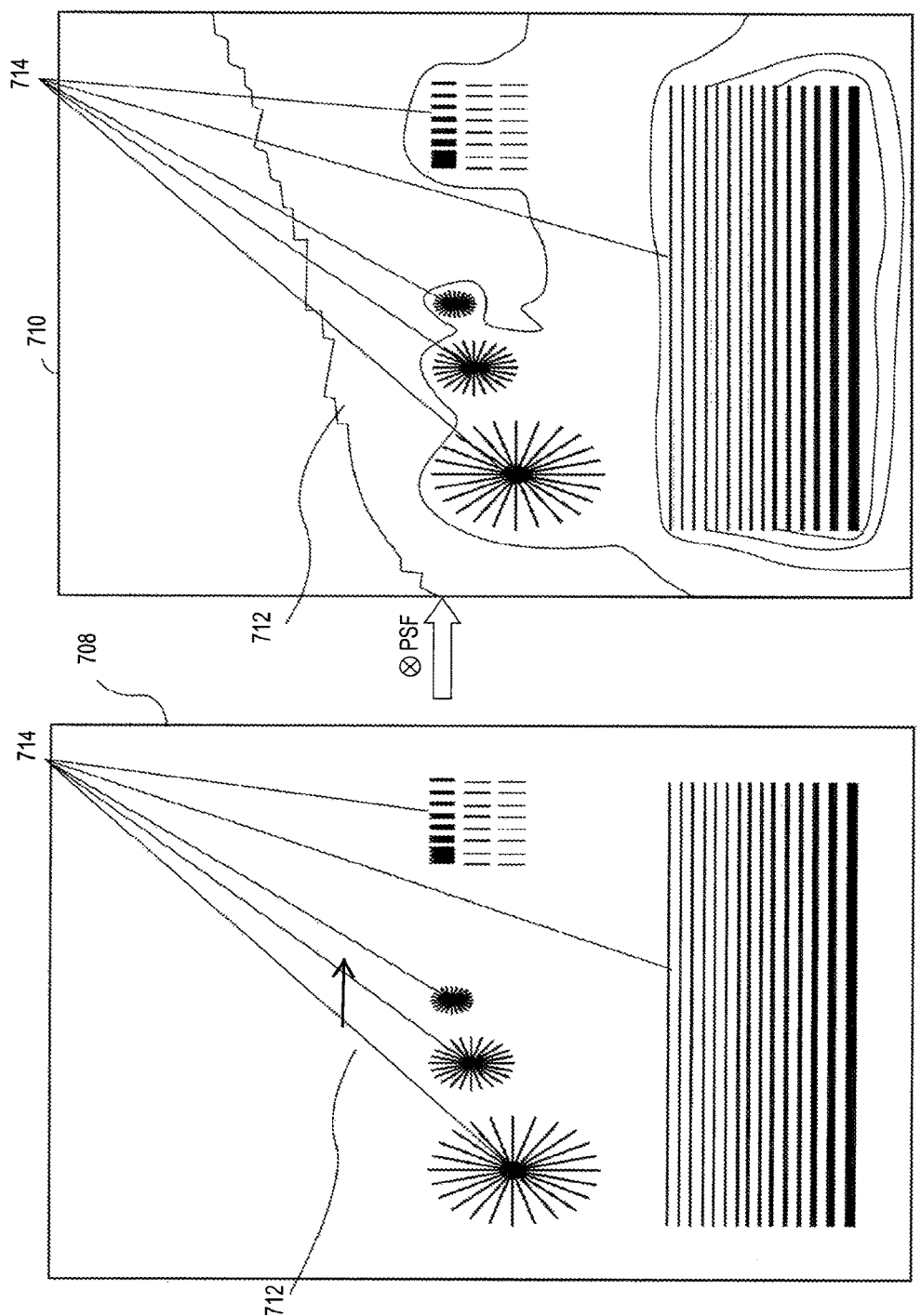
FIG. 7 shows an example of a density map being converted to a flare map.

FIG. 7 shows an example where a density map 708 showing various target patterns 714 (test patterns in this case) is convolved with a PSF, and flare map 710 is generated. Flare map 710 may be further improved by introducing the system-specific effects. Note that the density map 708 has a background area 712 where intensity is substantially constant. but in the flare map 710, the distribution of flare intensity in the background area 712 (where there is no target pattern 714 in the density map) is not constant, and varies depending on the distance of a point in the background area from the neighboring patterns that contributes to the PSF.

Figure 8:
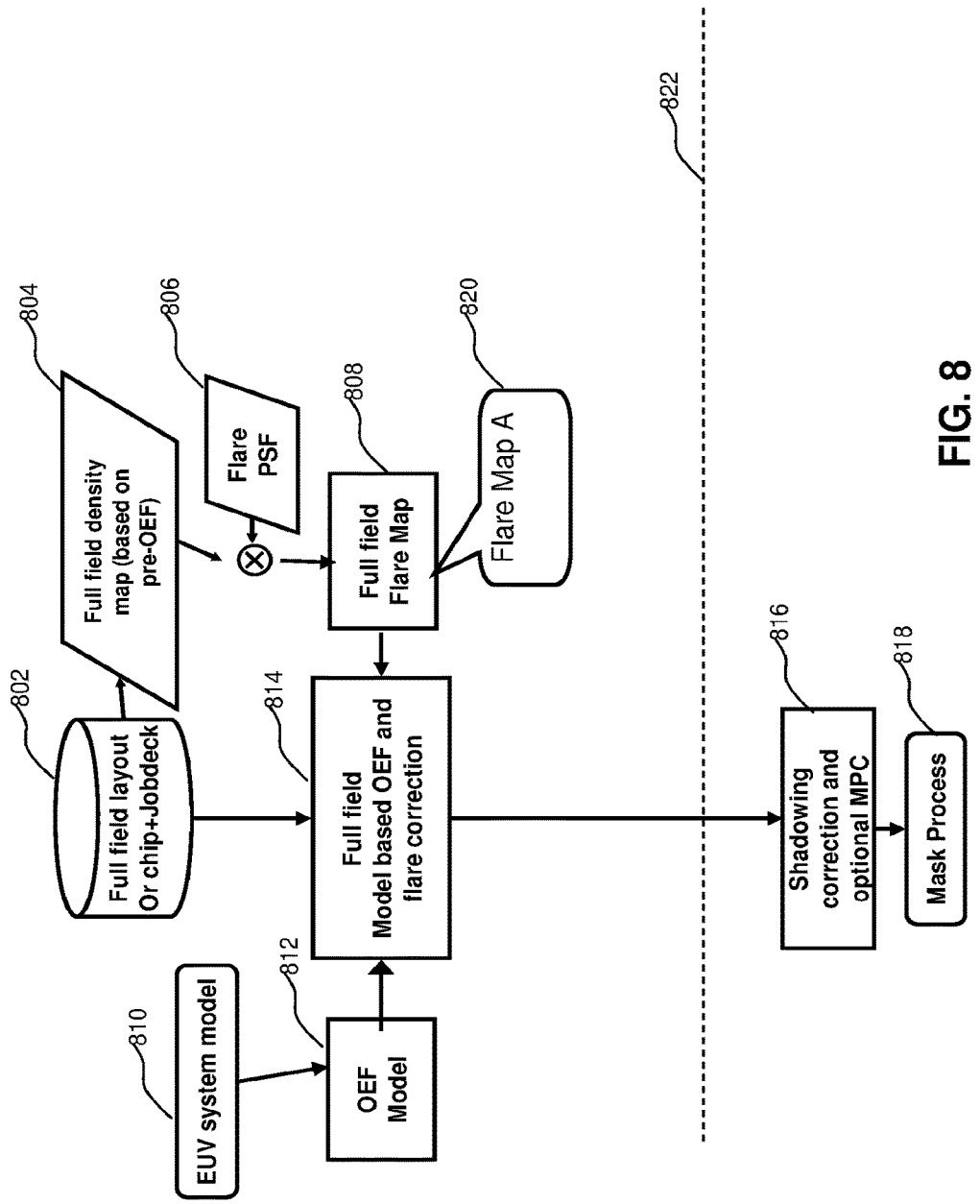
FIG. 8 shows a conventional one-stage flare correction process flow.

FIG. 8 shows a conventional process flow for flare map generation from an original target design layout. In step 802, either a full field layout is obtained, or a chip and jobdeck (i.e. a database containing information regarding location of the chip within the field) data is obtained. A pre-OEF density map is created in step 804. In step 806, flare PSF is obtained. In step 808, density map and flare PSF are convolved to generate full-field flare map A (element 820 in FIG. 8, also described in FIG. 6). In step 814, the flare map from step 808 is used to calculate the correction terms for the design layout as modified by OEF. OEFs are calculated from the optical model in step 812. OEF modeling step 812 may also incorporate a baseline model of the EUV system characteristics (step 810). Step 814 can be thought of as the only stage of applying flare correction in this single-stage process flow. All of the above steps are generally done in the optical modeling domain (as indicated above the dotted line 822). Further correction in the final design layout for the physical mask may be incorporated in the mask shop, as indicated below the dotted line 822. In step 816, shadowing correction and optional additional mask process correction (MPC) may be introduced. In step 818, the final design layout for the physical mask is derived for actual mask manufacture. Persons skilled in the art will understand that it is possible to encompass the shadowing and MPC corrections in the optical model itself, so the dotted line is illustrative of one possibility only.

Figure 9:
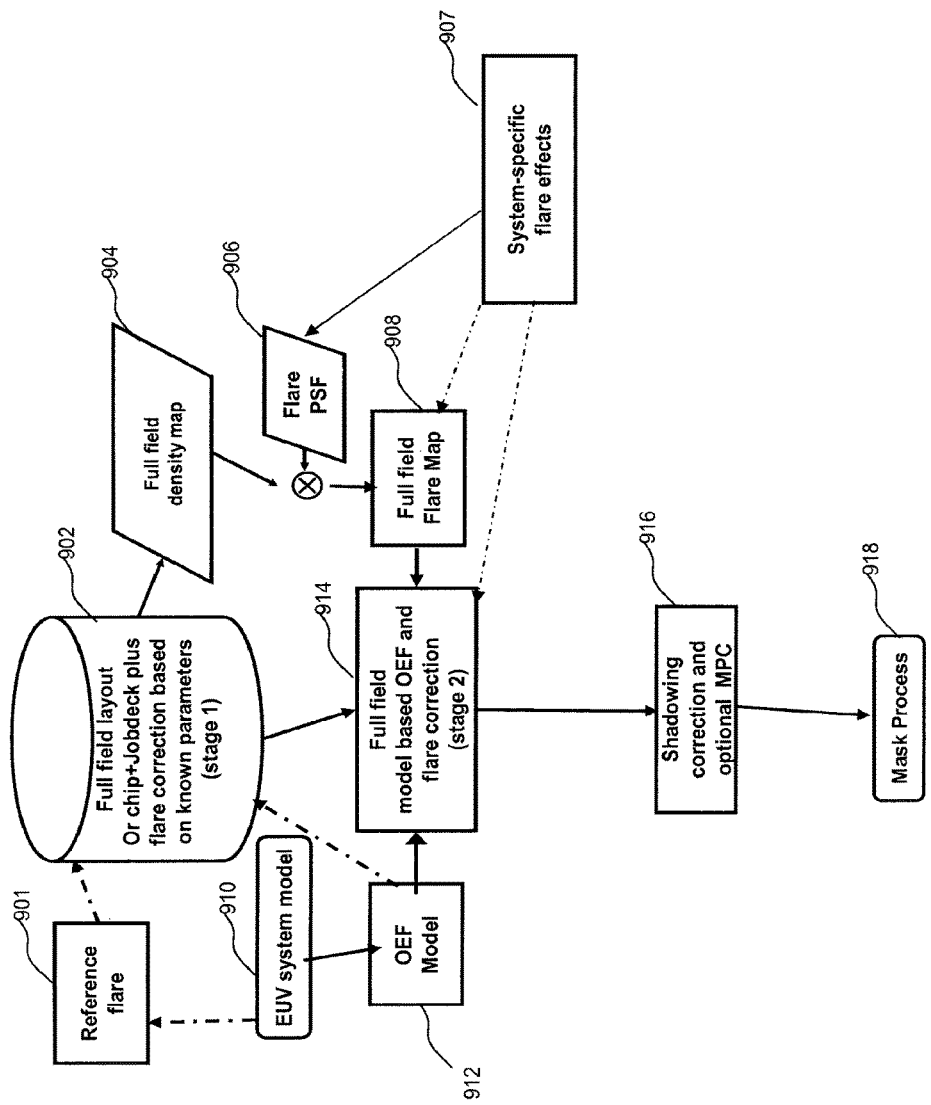
FIG. 9 shows a two-stage flare correction process flow, according to an embodiment of the present invention.
Figure 15:
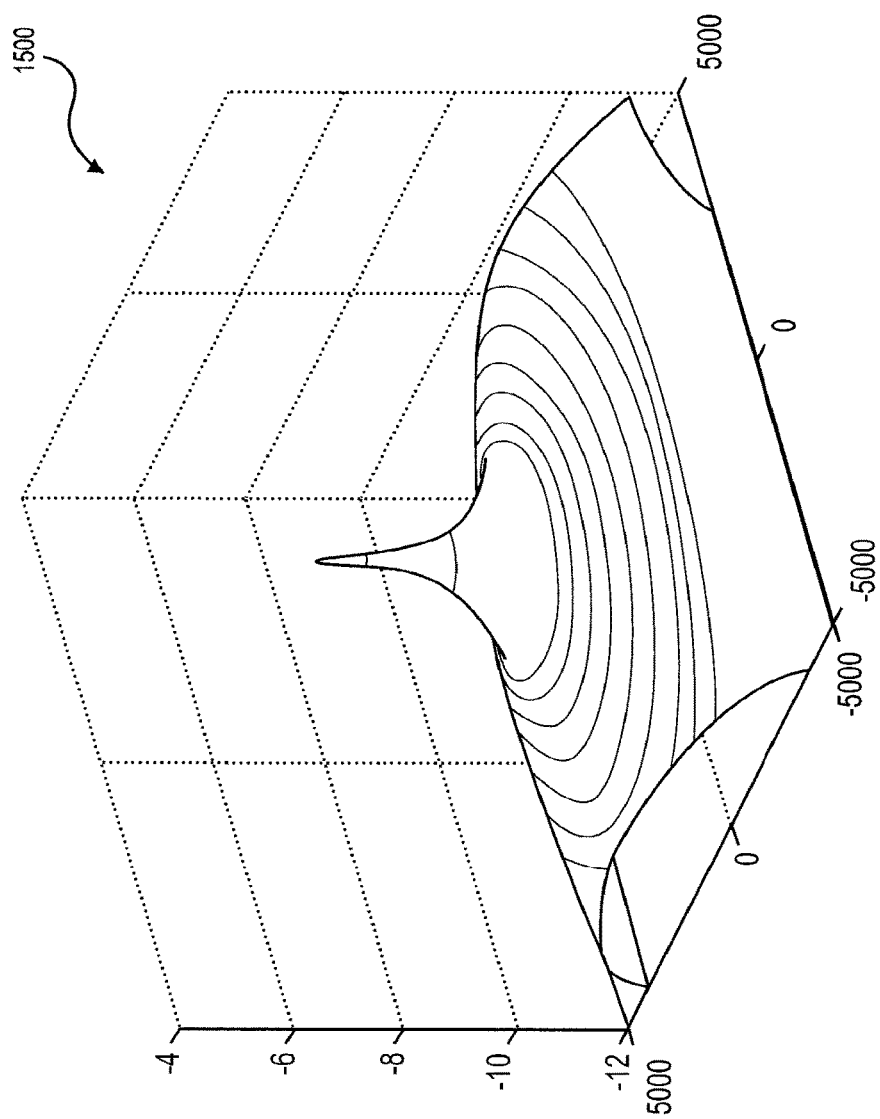

FIG. 9 shows one embodiment of the two-stage process of the present invention. Many of the steps in this FIG. are similar to the equivalent steps of FIG. 8, so only the key difference between the process flows of FIGS. 8 and 9 are discussed here. One key difference is that in step 2, a first stage of flare correction is done. In this stage known parameters, such as, at least one of a reference flare value (step 901) and OEF model output (step 912) is used to modify the full-field layout/the chip jobdeck data. Reference flare value may be part of the EUV system model (step 901). Therefore, the density map in step 904 is created from the design layout modified by the known parameters. Steps 906, 908, 914, 910, 912, 916 and 918 are substantially identical to steps 806, 808, 814, 810, 812, 816 and 818, respectively. The system-specific effects 907 are introduced either to modify the PSF in step 906 (as shown in FIG. 15), or to further improve the flare map in step 908. It is also possible to introduce mask corrections for system-specific effects as an additional correction in step 914, where a level of mask design layout correction has already been done using the flare map from step 908, which is not modified by the system-specific flare effects. In other words, the correction process is flexible enough to take care of the system-specific flare effects at different stages of the total correction process. The system-effect correction at PSF level is the most common procedure, as shown by the solid line. The other possibilities are indicated by the dash-dot lines.

Figure 10:
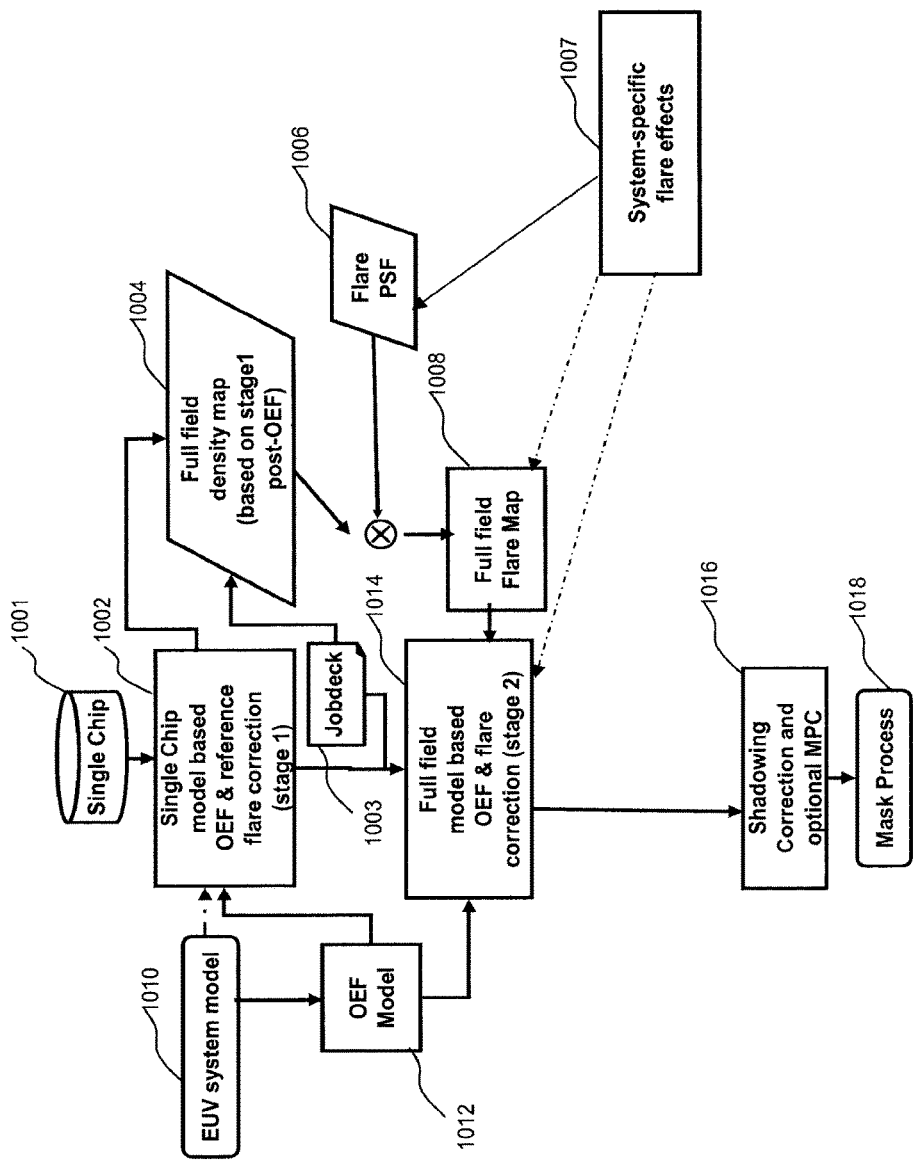
FIG. 10 shows another two-stage flare correction process flow according to an embodiment of the present invention where a repetitive pattern's design layout is used to incorporate flare correction in the first stage.

FIG. 10 shows another embodiment of the present invention, where stage 1 flare correction is based on correcting the layout of a single chip rather than the entire full field design layout. This reduces computational burden, as with the jobdeck information, the modified design layout of a single chip can be replicated easily to recreate the density map for the full field in step 1004. In step 1001, a design layout of a single chip is obtained. In this implementation, typically both the reference flare correction (with, for example, an average flare value that may be known from experience, or may be supplied by the EUV system model 1010) and OEF output for a single chip are used for a first level of flare correction, though the scope of the invention is not limited by the type of first level correction applied. For example, a density map can be recreated by replicating the original pre-OEF pre-reference-flare design layout of a single chip with the help of the jobdeck 1003. Flare PSF in step 1006 may be an isotropic PSF that does not depend on the location of the field (such as the PSF in FIG. 14), or it may be an anisotropic PSF (such as the PSF in FIG. 15) that includes the field-location dependent modifications resulting from EUV machine specific effects, as discussed before, and will be discussed further below. Full field flare map 1008 is of improved accuracy, but is generated in less time using less computational resource. In stage 2 (step 1014), a further correction of the design layout is done using the flare map from step 1008. The jobdeck 1003 and full-fledged OEF model from step 1012 are also used in step 1014. Steps 1016 and 1018 are substantially similar to steps 816 and 818, as discussed above. As discussed with respect to FIG. 9, the correction process is flexible enough to take care of the system-specific flare effects 1007 at different stages of the total correction process, i.e. at PSF level (step 1006), at flare map level (step 1008), or at stage 2 final correction level (step 1014).

4. Various Sources of Machine-Specific Flare Effects

FIG. 11 shows the schematic geometry of a portion of an EUV lithography system, showing various example elements that contribute to flare effects. An EUV mask 1101 has a pattern area 1102 surrounded by the black border (BB) area 1104, where there is no pattern. The black border is usually an opaque area. The BB area 1104 serves to demarcate between two consecutive exposure fields. Some stray radiation reflecting off of the black border leads to flare effects at the field edge. The pattern area 1102 of the reflective EUV mask 1101 reflects off the imaging light 1116 onto a target portion of the wafer 1120 with the help of projection system 1115. The imaging light 1116 is mostly EUV light, but may have residual DUV component too, Due to the scattering in the projection system, EUV (and DUV) flare 1114 is generated, which is taken into account in generating a flare map. Additionally, an incident part 1110 of the imaging light may be reflected back (reflected stray light 1112) by the reticle masking (ReMa) blades 1106 and 1108, leading to flare effects at the field edge. ReMa blades define an exposure slit within an exposure field, while there are one or more (typically multiple) exposure slits within an exposure field. ReMa blades are typically mounted on movable structures so that they can scan the field to define a current exposure slit, and then move further to define the next exposure slit. ReMa blade 1108 has a pair of blades in the y direction, and ReMa blade 1106 has a pair of blades in the perpendicular x direction (only one blade of the pair in x direction is being shown in this schematic view.) Though the ReMa blades prevent most of the stray reflection from the black borders, some stray reflection from the black border does reach the wafer to contribute to flare effects. Moreover, in some versions of the demonstration tool, one pair of ReMa blades (either in x direction or in y direction) are used. So black border reflection from the open direction of the slit may contribute to flare. In order to reduce EUV (and remnant DUV) reflection from black border, the mask may be fabricated in a special way, where the absorption in the black border area may be substantially increased, or the reflective multi-stack MoSi layers and the top metal layer in the black border area are removed by additional etching. Further discussion about the black border reflection control can be found in the paper titled, "Thin absorber EUV mask with light-shield border of etched multilayer and its lithographic performance," by Kamo et al. (Proc. Of SPIE vol 7748, pp. 774805-1 to 774805-10). If the mask is modified to alter the black border reflection, then the flare simulation parameters also need to be suitably adjusted to represent the modified mask reflection from the black border areas.

Two more possible factors that can affect the flare map, specially at the field edge, are inter-field effect and overscan effect. Inter-field effect results from the contributions from neighboring fields, and is discussed further with respect to FIG. 13. Overscan effects result from possible slight imprecision in travel length of the moving components of an EUV exposure tool during sequential exposure within a field, or during moving from one field to an adjacent field.

Another structural component shown in FIGS. 11 and 12 that contributes to flare is a dynamic gas lock (DGL) mechanism 1118. FIG. 12 schematically depicts a lithographic apparatus according to a non-limiting embodiment of the invention. The chamber 1210 (e.g. vacuum chamber) for projection optics systems PS and the chamber 1230 (e.g. vacuum chamber) for the substrate table or "substrate support" WT are shown in FIG. 12 so as to illustrate the non-limiting concept of the shared "opening" 1220 (created by an apertures diaphragm) between the chambers, a so-called dynamic gas lock (DGL), where gas flows are maintained to prevent contamination(s) from traveling through the opening. In FIG. 12, other components of the lithography tool have not been shown for clarity purposes. Details of the dynamic gas lock (DGL) mechanism can be found in co-pending co-owned patent application no. US 2010/0002207, titled, "Lithographic Apparatus and Device Manufacturing Method," to Loopstra et al., filed Jun. 12, 2009, which is incorporated herein in its entirety as reference.

The projection system PS may consist of reflective optics (e.g. mirrors), which surface flatness is controlled with the atomic level. Such optics may easily be damaged in case small particles come into the first chamber and are attached on the surface of the optics. Therefore, although both chambers are typically under very high vacuum levels during operation, the chamber for the projection system PS is typically maintained with higher pressure than it is in the chamber for substrate table WT, because the optics should be kept as clean as possible while the chamber for substrate is normally a source of unwanted molecules contaminations (e.g. out-gassing from resist, particles generated due to movable parts like wafer stages). In practice, the first chamber may be purged (although the pressure of the chamber is very low) with a certain gas (e.g. hydrogen, nitrogen, helium or carbon dioxide) to keep optical elements for the projection system PS clean.

Though DGL is important for the operation of the lithography tool, the physical structure 1118 of the DGL contributes to flare effects that need to be taken into account to generate an accurate flare map. FIGS. 16-20 describe how the effect of reflection from a gas-lock sub-aperture of the DGL has been incorporated in simulating a flare map.

Figure 13:
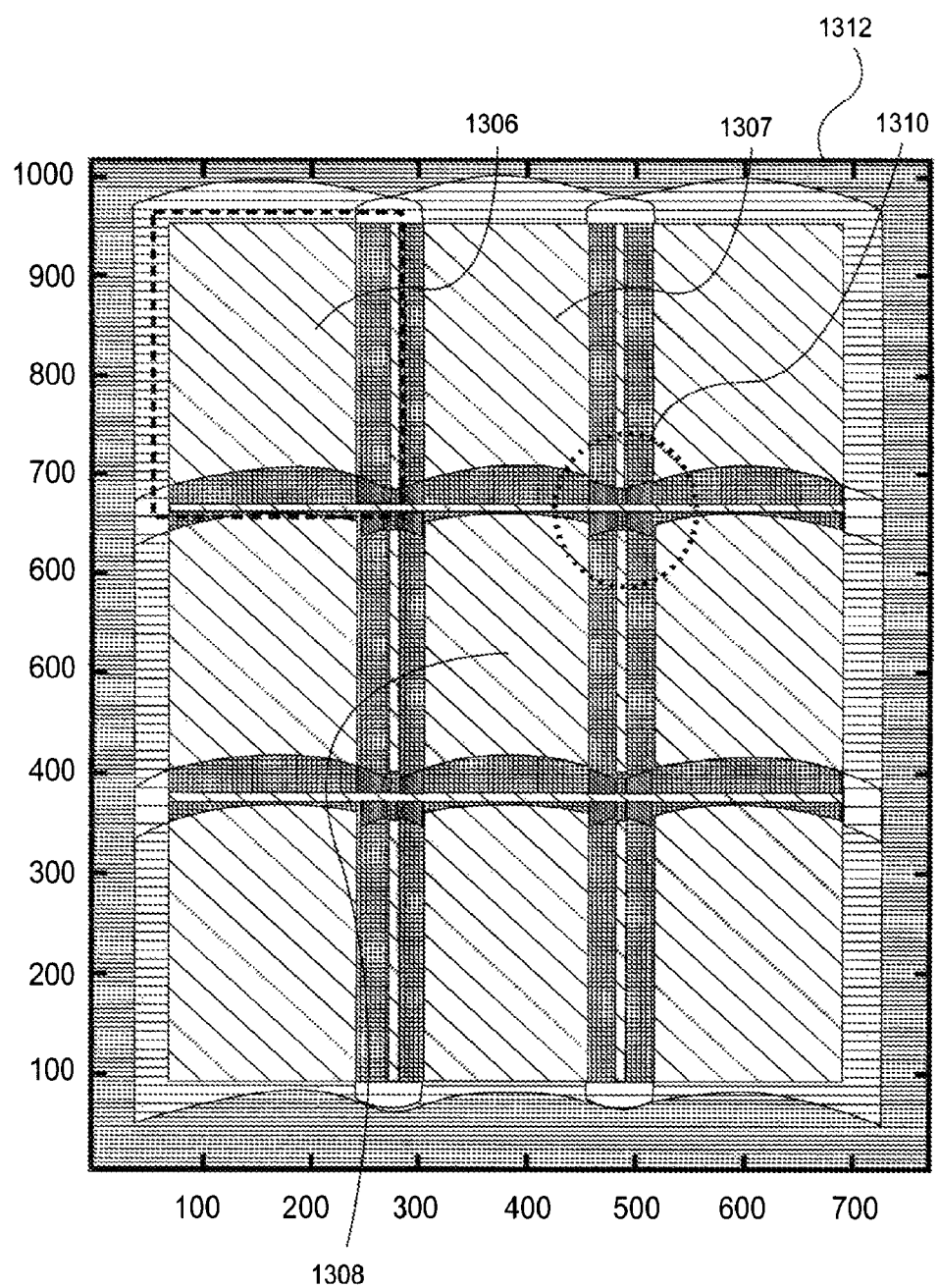
FIG. 13 shows inter-field flare effects, according to an embodiment of the present invention.

FIG. 13 shows a simulation of inter-field effect. An arbitrary rectangular area 1312 (with arbitrary length units along x and y axes) have been simulated, comprising nine adjacent exposure fields (one example exposure field is shown within the dashed rectangle.) For a demonstration tool, the field size of an individual field is fixed by design (26 mm.times.32 mm). EUV and residual DUV reflection from the field edge effects, as discussed above, and stray radiation can cause significant levels of flare within a particular exposure field that are contributed by its neighboring exposure fields. For example, each corner area 1310 (shown within the dotted circle) of an exposure field 1308, surrounded by other exposure fields in all direction may show enhanced flare intensity due to inter-field effect. For exposure fields that are along the periphery, i.e., at least in one direction, there is no adjacent exposure field, (e.g., fields 1306 and 1307), some corners will have enhanced flare intensity compared to other corners. The different patterns within area 1312 indicate different intensity levels.

Figure 14:
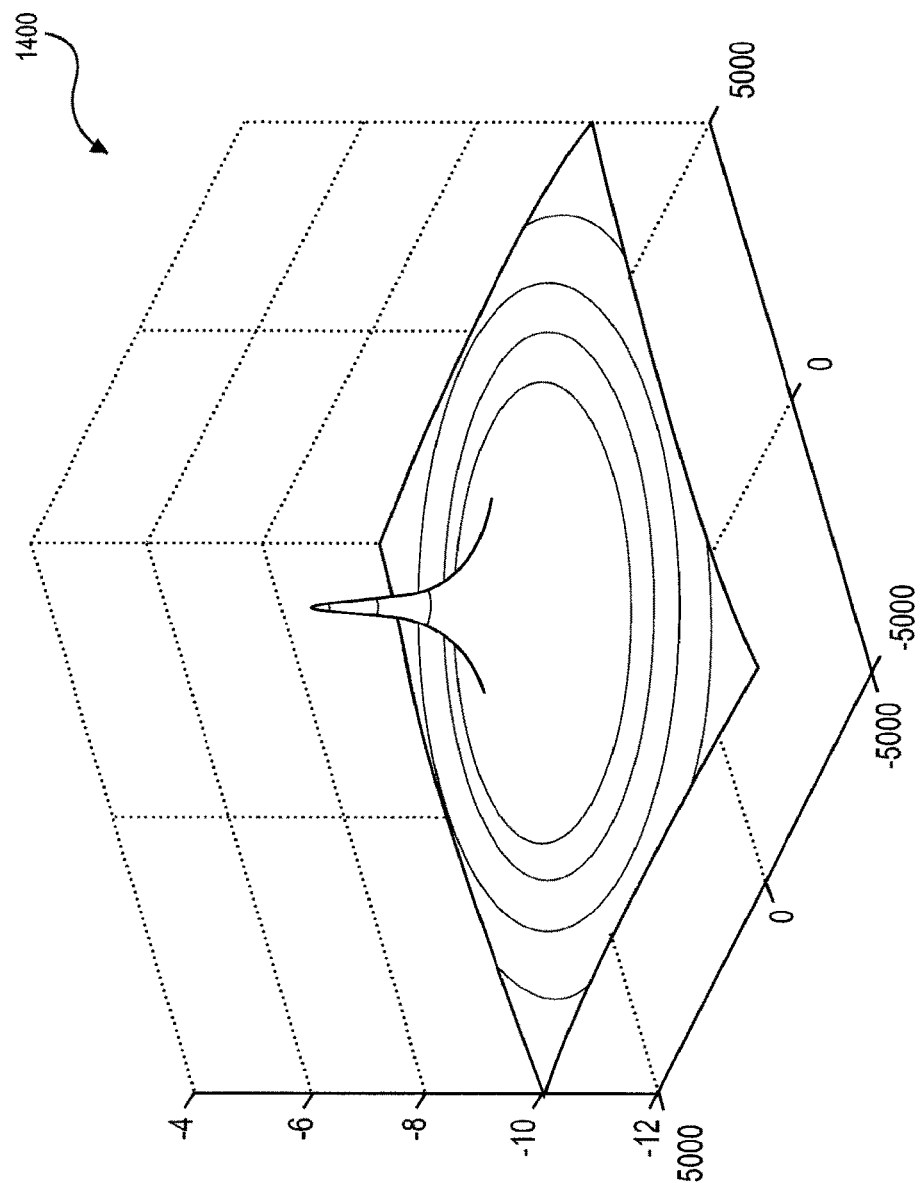
FIGS. 14 and 15 show isotropic and anisotropic point spread functions (PSF), respectively.

FIG. 14 shows a PSF 1400 assuming an isotropic condition, i.e. flare distribution is evenly spread across an exposure field. The horizontal axes are in micrometers, while the vertical axis is in arbitrary unit in logarithmic (base 10) scale. Most of the prior art solutions adopts this condition, that may lead to less accurate flare map generation. FIG. 15 shows a modified PSF 1500 (gain in logarithmic scale), generated using a location-dependent anisotropic flare distribution within the field, according to embodiments of the present invention. The change in shape of the contour plot in FIG. 15 with respect to the plot in FIG. 14 is conspicuous. This is closer to the real-life situation in a lithography tool, and leads to more accurate flare map generation.

5. Illustrative Results from Flare Simulation

FIG. 16 show an outline of an exposure slit 1602. When an isotropic flare distribution is assumed (top left hand figure in FIG. 16), then it is assumed that the overall flare from a point source is the same in all directions, as shown symbolically with the circle and the arrows. In contrast, the present invention assumes an anisotropic condition, where flare from a point source varies in different directions according to the particular location of the point source within the field or slit, as shown symbolically with the oval and the arrows (top right hand figure in FIG. 16). In the illustrative example shown in FIG. 16, the effects of DGL is shown by comparing the flare intensity difference under isotropic condition (flare map 1606) with no DGL and anisotropic condition (flare map 1610) with the DGL. The intensity bar 1608 showing arbitrary units helps visualize the intensity difference. In simulating the flare maps 1606 and 1610, an isolated field has been assumed where only inter-field effects have been neglected, but other field edge effects, such as flare effects due to BB, overscan, and ReMa blades, have been represented within the flare map.

Figure 17A:
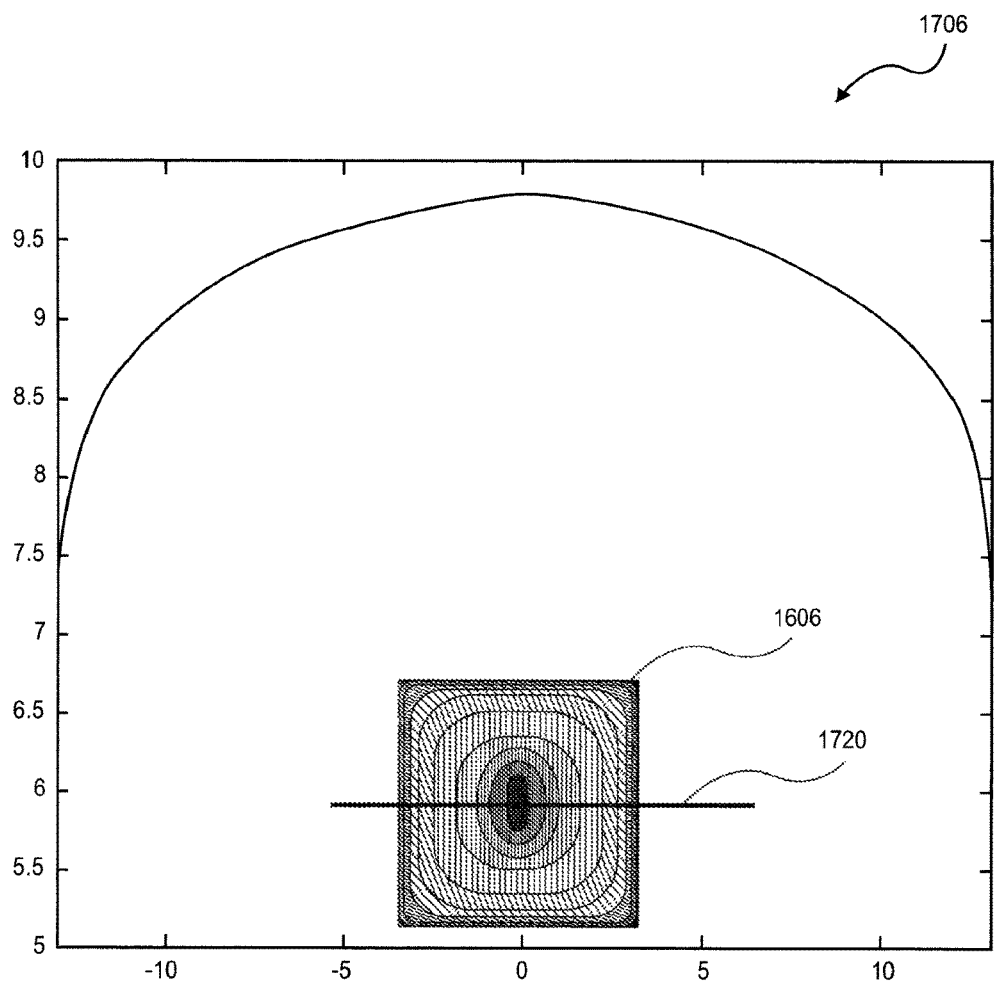
Figure 17B:
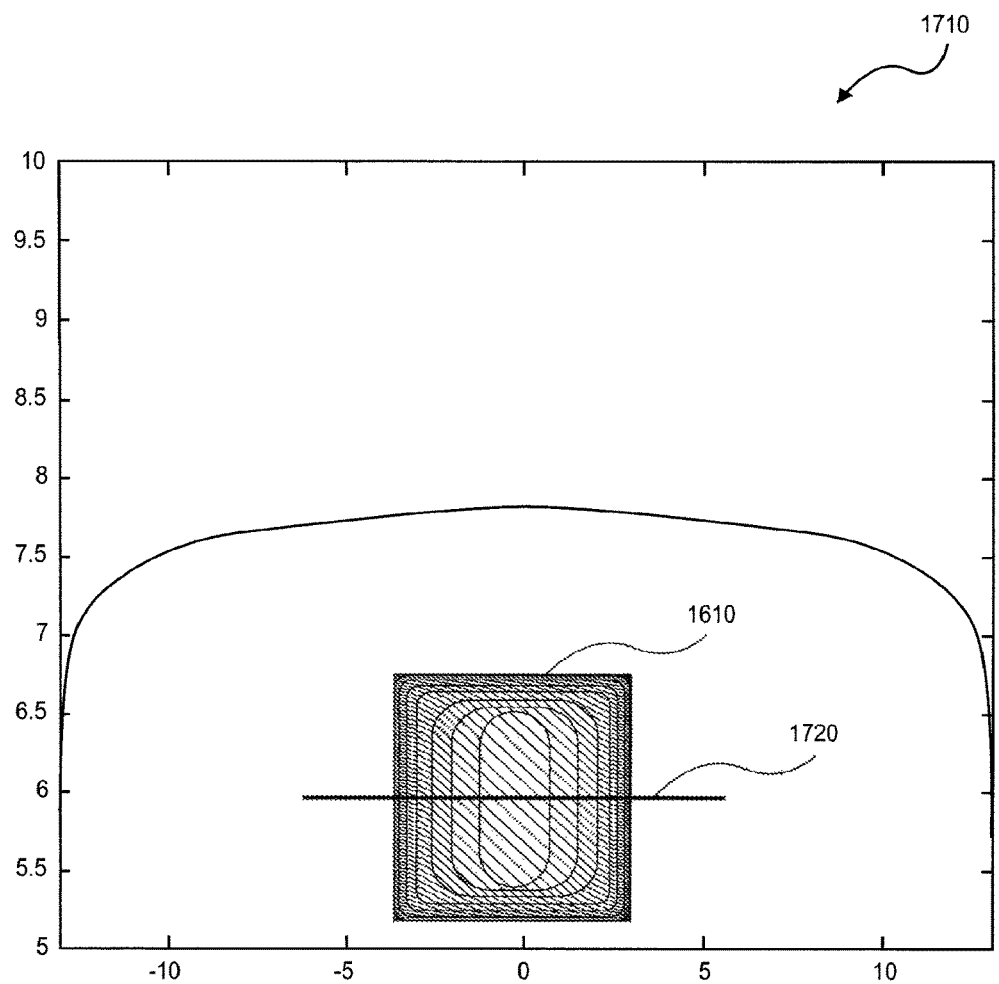

FIGS. 17A-B show intensity plots along a horizontal cut line 1720 through the center of the field. Comparing the intensity plots 1706 (isotropic, no DGL flare effect) and 1710 (anisotropic, with DGL flare effect), it can be concluded that the overall flare intensity decreases in the anisotropic simulation of the present invention. Reduced flare intensity can be translated to tighter CD control and less rigorous design layout modification.

Figure 18A:
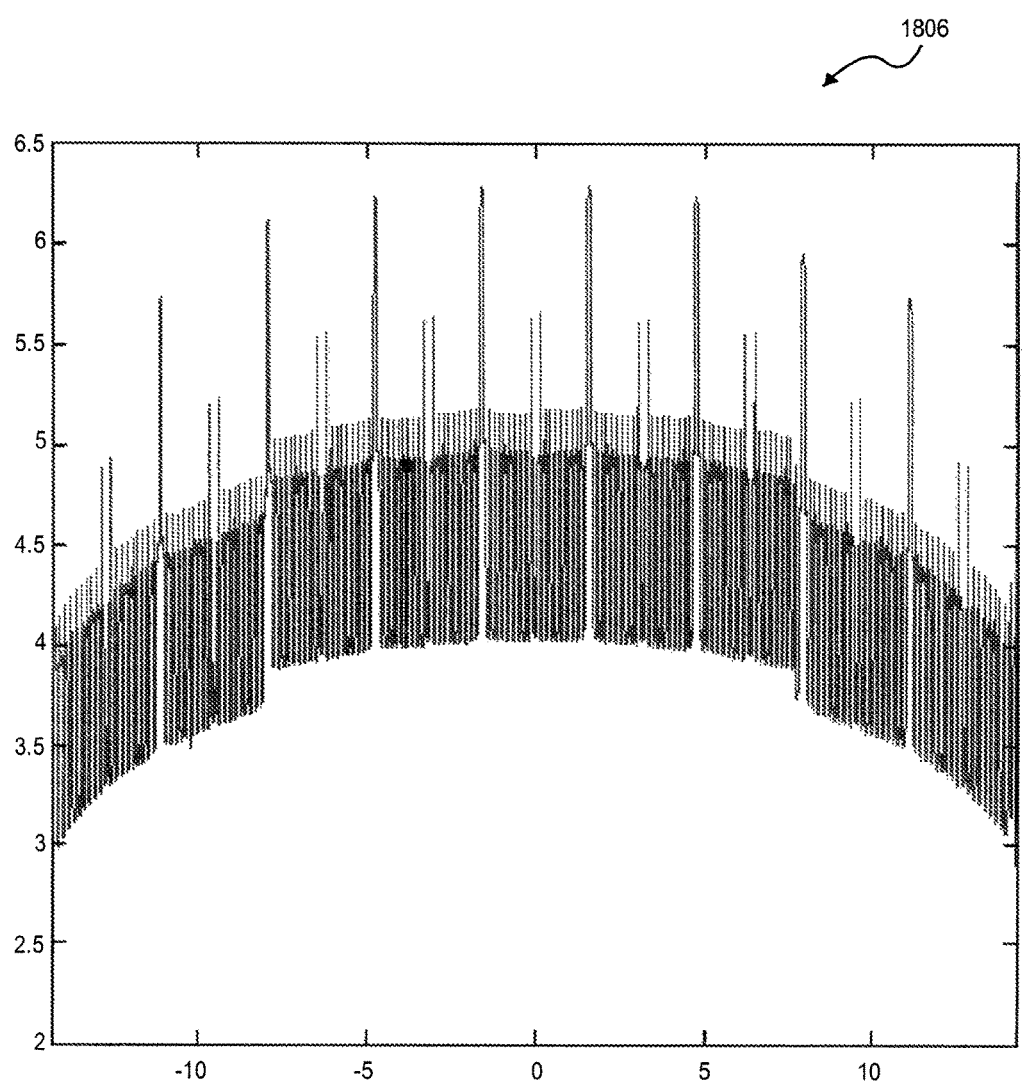
Figure 18B:
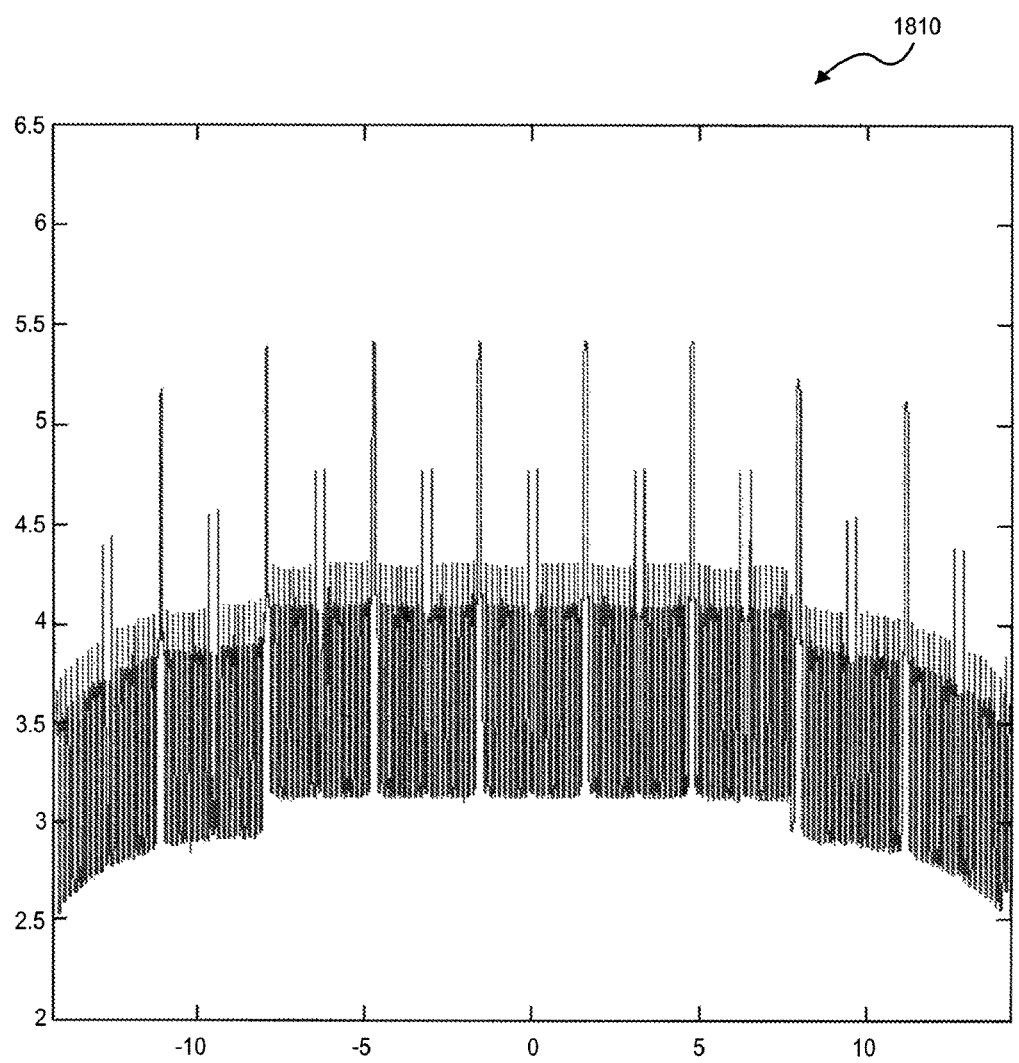

FIGS. 18A-B show two intensity plots 1806 and 1810 along the horizontal centerline 1720 as shown in FIG. 17 under similar conditions (i.e. isolated field, showing the effect of DGL), but this time with active chips within the field. The spikes shown in the plot are the result of chip-to chip flare variation in horizontal direction.

Figure 19A:
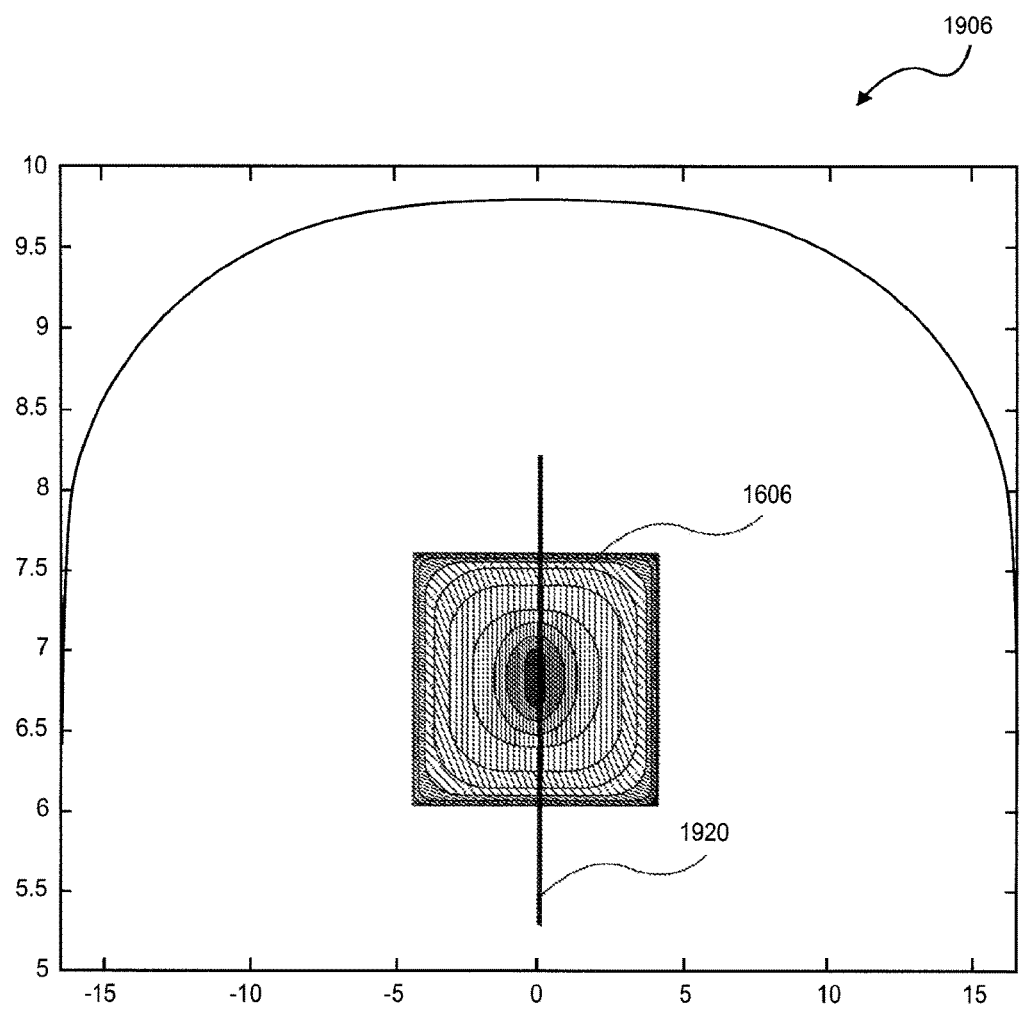
Figure 19B:
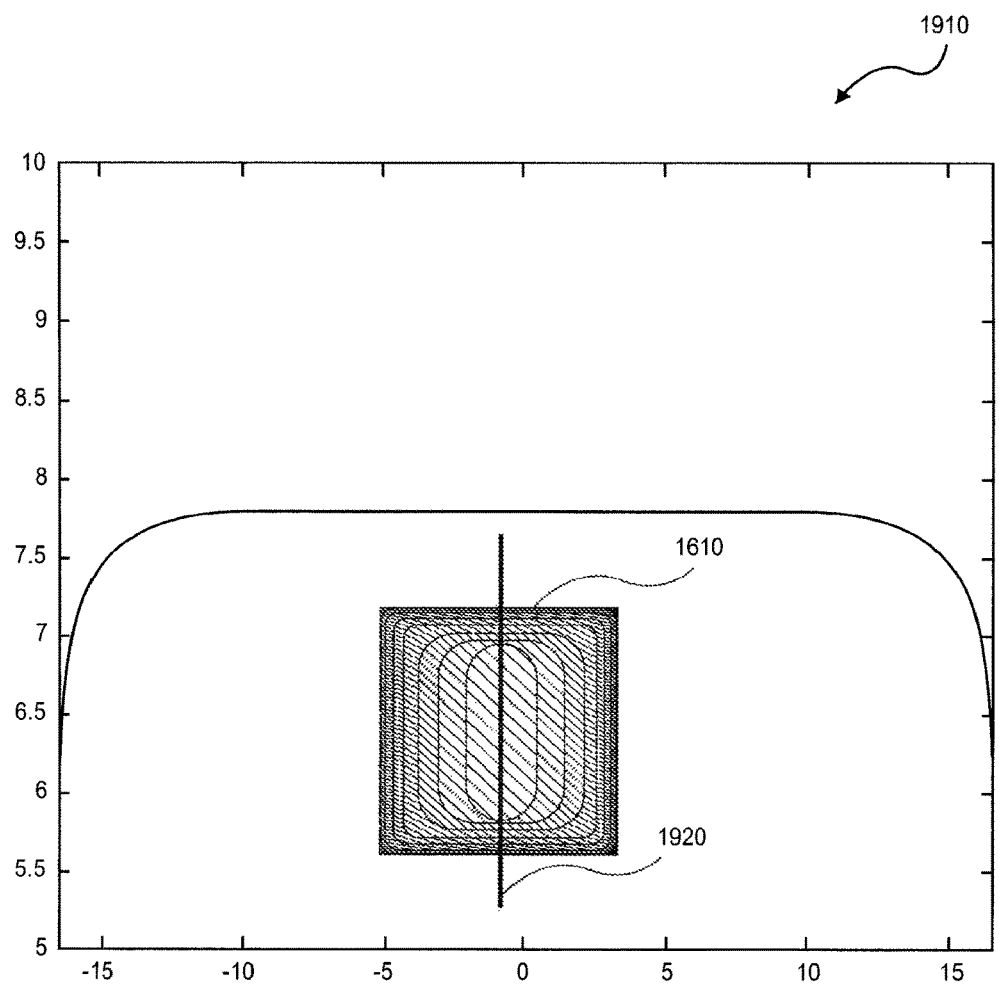

FIGS. 19A-B show intensity plots along a vertical cut line 1920 through the center of the field. Comparing the intensity plots 1906 (isotropic, no DGL flare effect) and 1910 (anisotropic, with DGL flare effect), it can be concluded that the overall flare intensity decreases in the anisotropic simulation of the present invention.

Figure 20A:
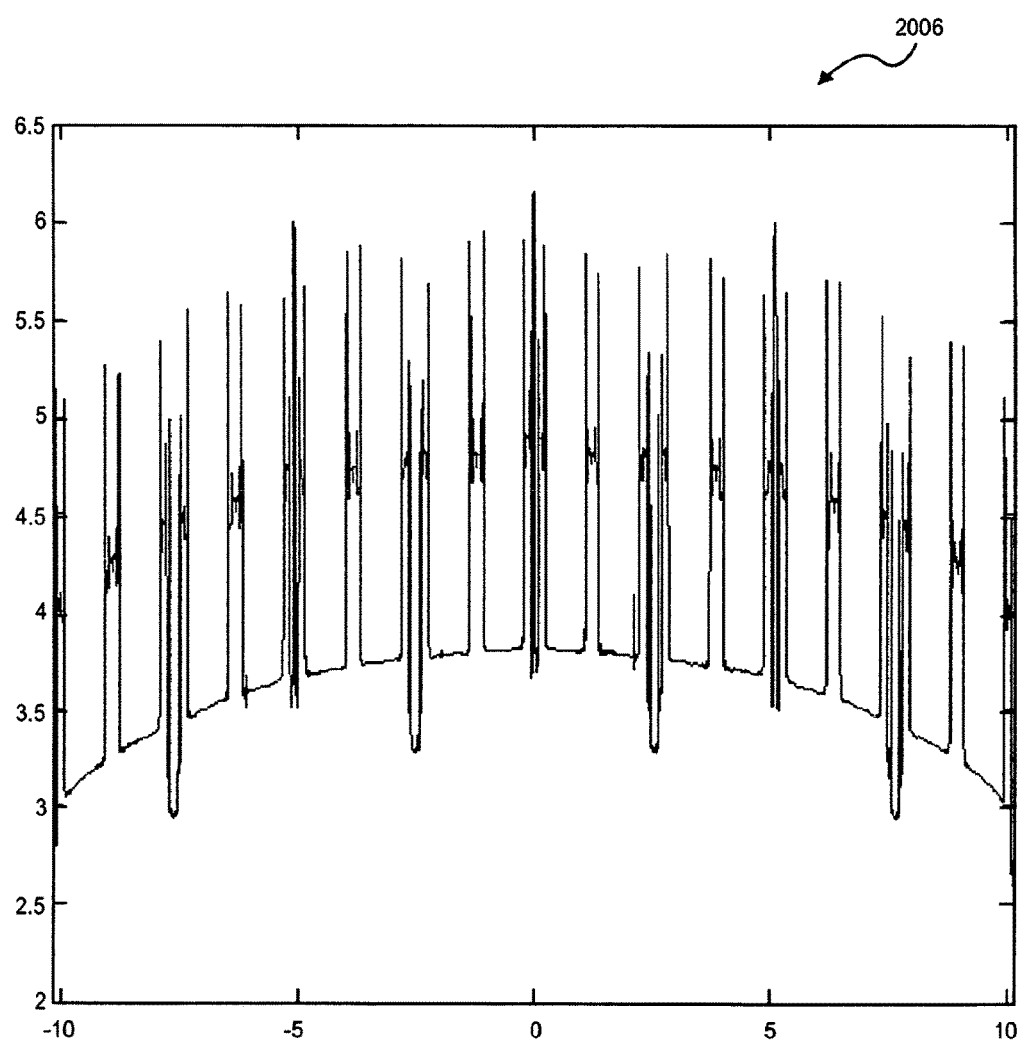
Figure 20B:
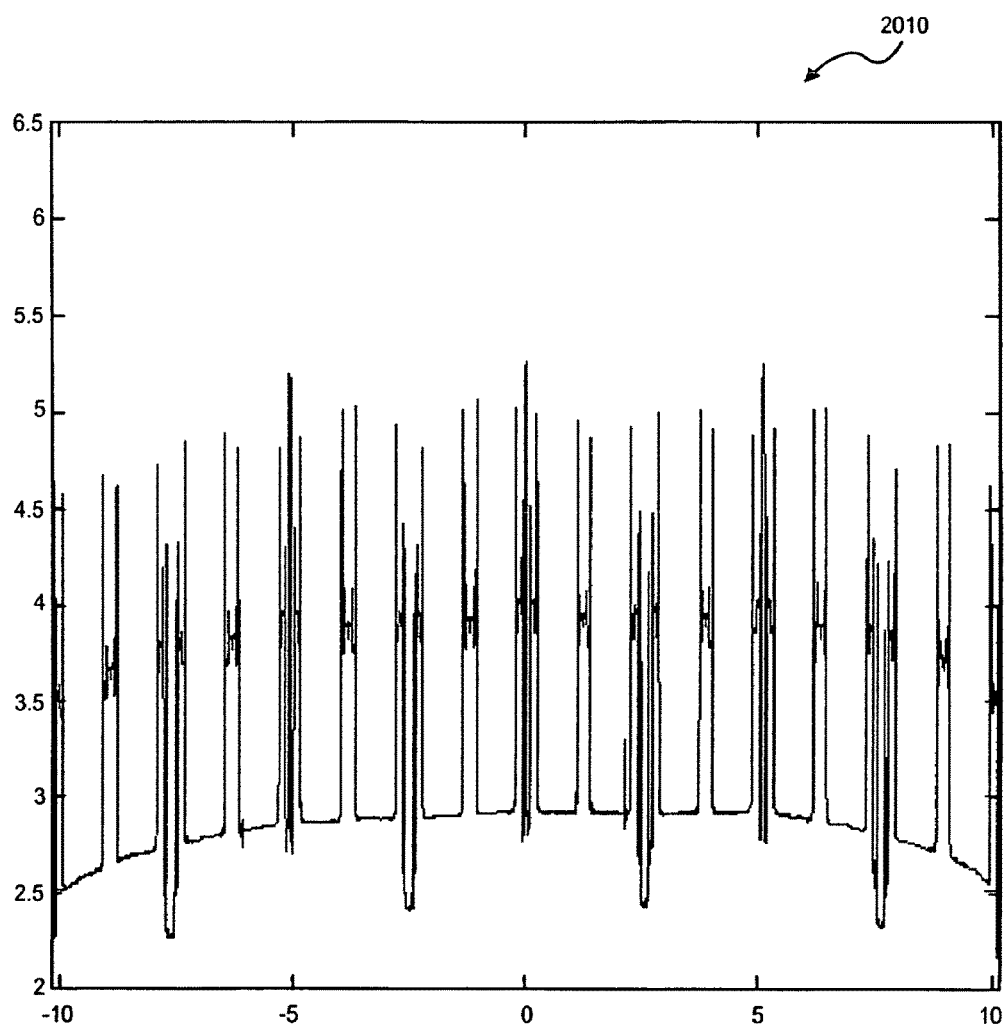

FIGS. 20A-B show two intensity plots 2006 and 2010 along the vertical centerline 1920 as shown in FIGS. 19A-B under similar conditions (i.e. isolated field, showing the effect of DGL), but this time with active chips within the field. The spikes shown in the plot are the result of chip-to chip flare variation in vertical direction.

Almost 1% flare reduction is observed by properly modeling the effect of DGL. This translates to roughly 1 nm variation in DC, and appropriate mask design layout modification is necessary.

Persons skilled in the art will appreciate that though only the flare intensity reduction due to DGL is shown in the above examples in FIGS. 16-20, it is possible to show the effect of each of the other contributing factors, such as reflection from BB, reflection from ReMa etc., by keeping the other contributing factors constant. It is also possible to simulate combined effect of two or more system-specific effects in a single flare map.

Figure 21:
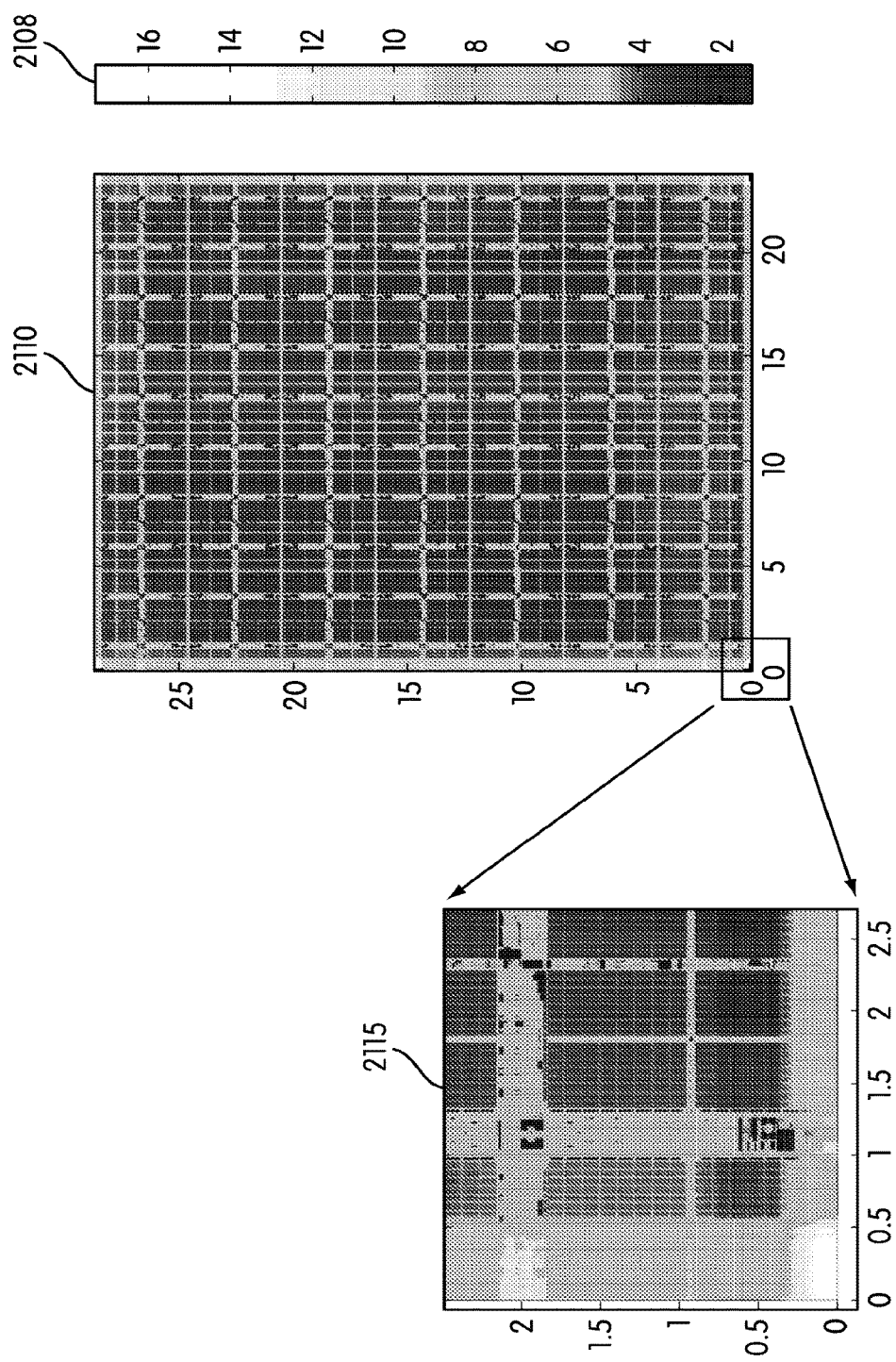
FIGS. 21, 22, 23A, 23B, 24A, 24B and 25 show various results of the simulation according to embodiments of the present invention.

For example, in FIG. 21, full field flare map 2110 (with the intensity bar 2108) shows flare distribution in an example DRAM poly layer due to a combined field edge effect (i.e. flare contributions from black border, ReMa blades and overscan) and inter-field effect. A 4% remnant DUV reflection is assumed in addition to the EUV reflection. In the corner region 2115, higher flare is observed.

Figure 22:
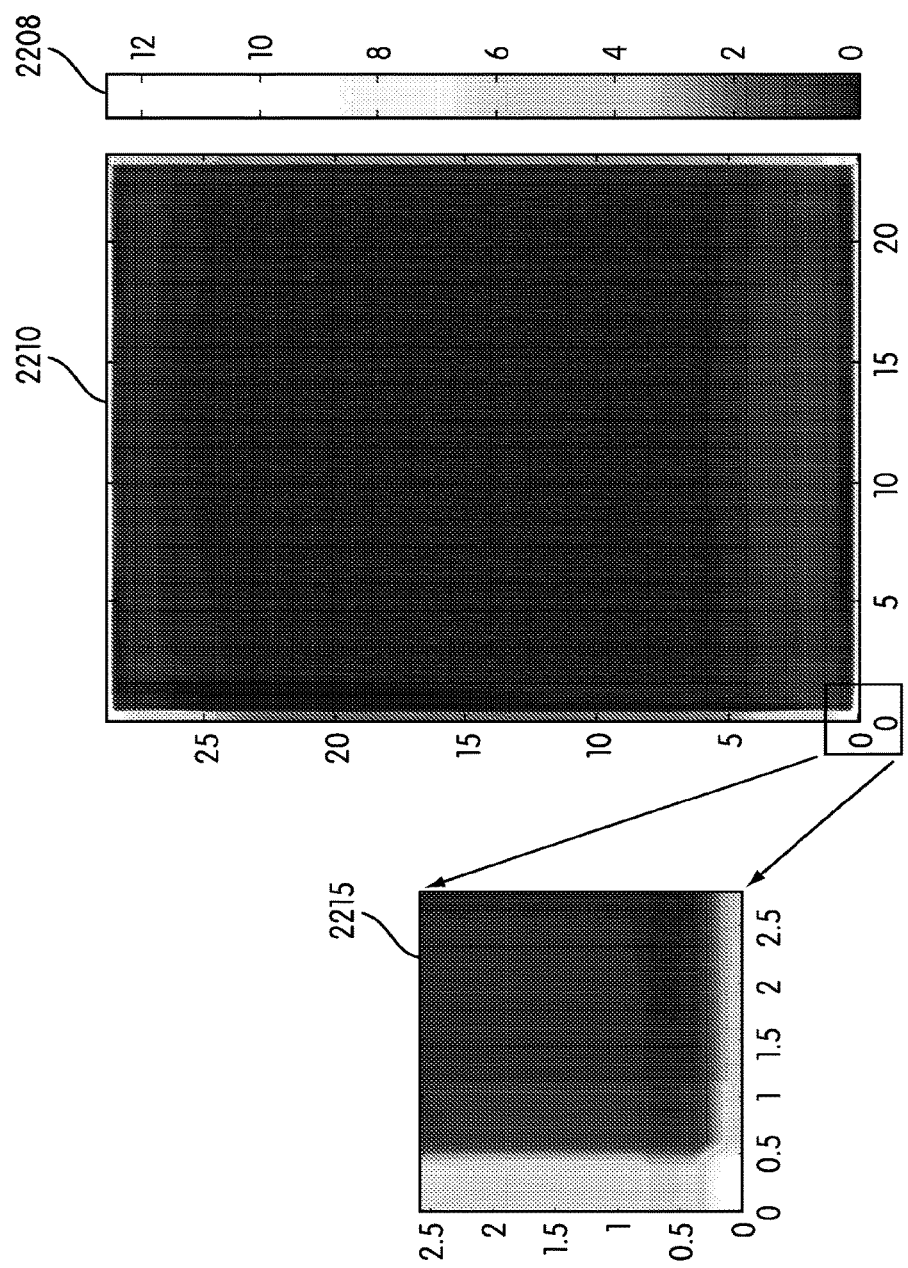

FIG. 22 shows the full field flare map difference between the flare map 2110 of FIG. 21, and another flare map (not shown) that is generated without taking the edge effects into account. Only the flare difference values are plotted as contours in the map 2210, and corner region 2215. 2208 is the intensity bar. Note that both maps (i.e. flare map with edge effect and flare map without edge effect) assume an identical flare contribution due to reflection from DGL. Almost 12% flare difference at the corner is mostly contributed by inter-field effect.

Figure 23A:
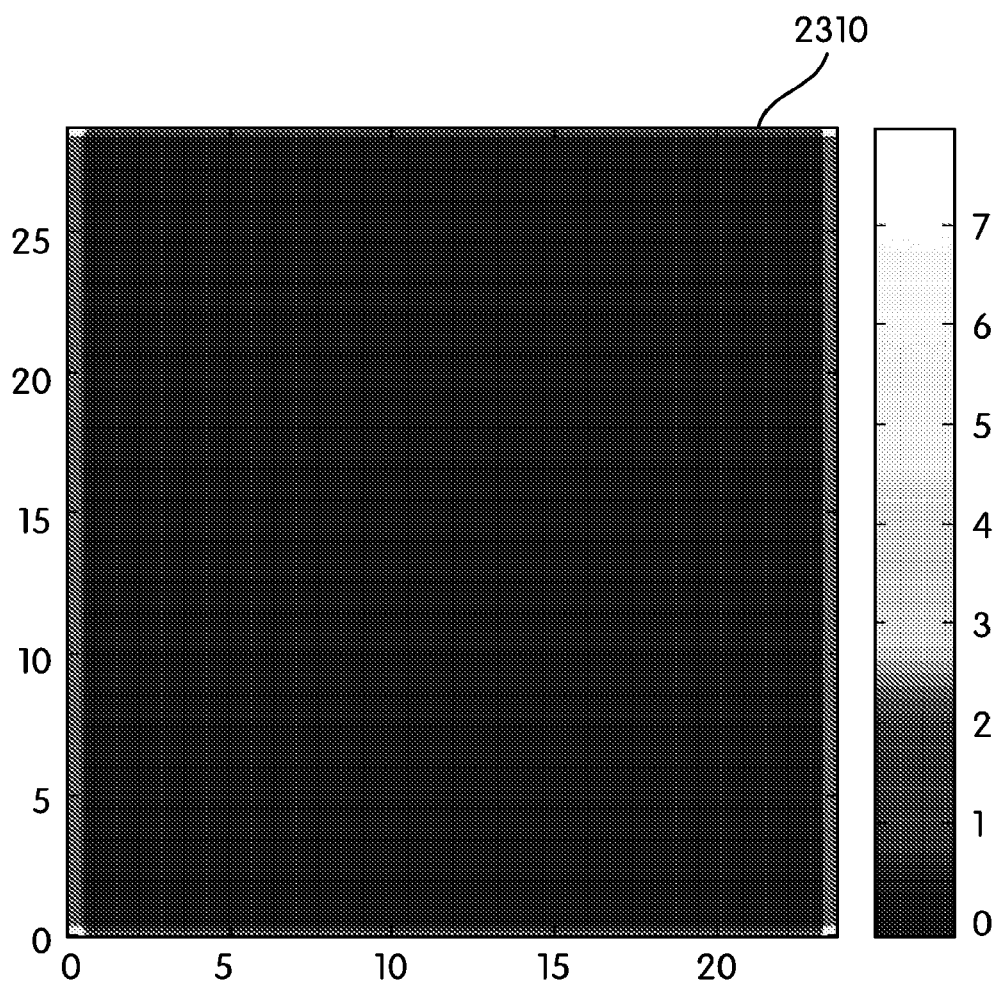
Figure 23B:
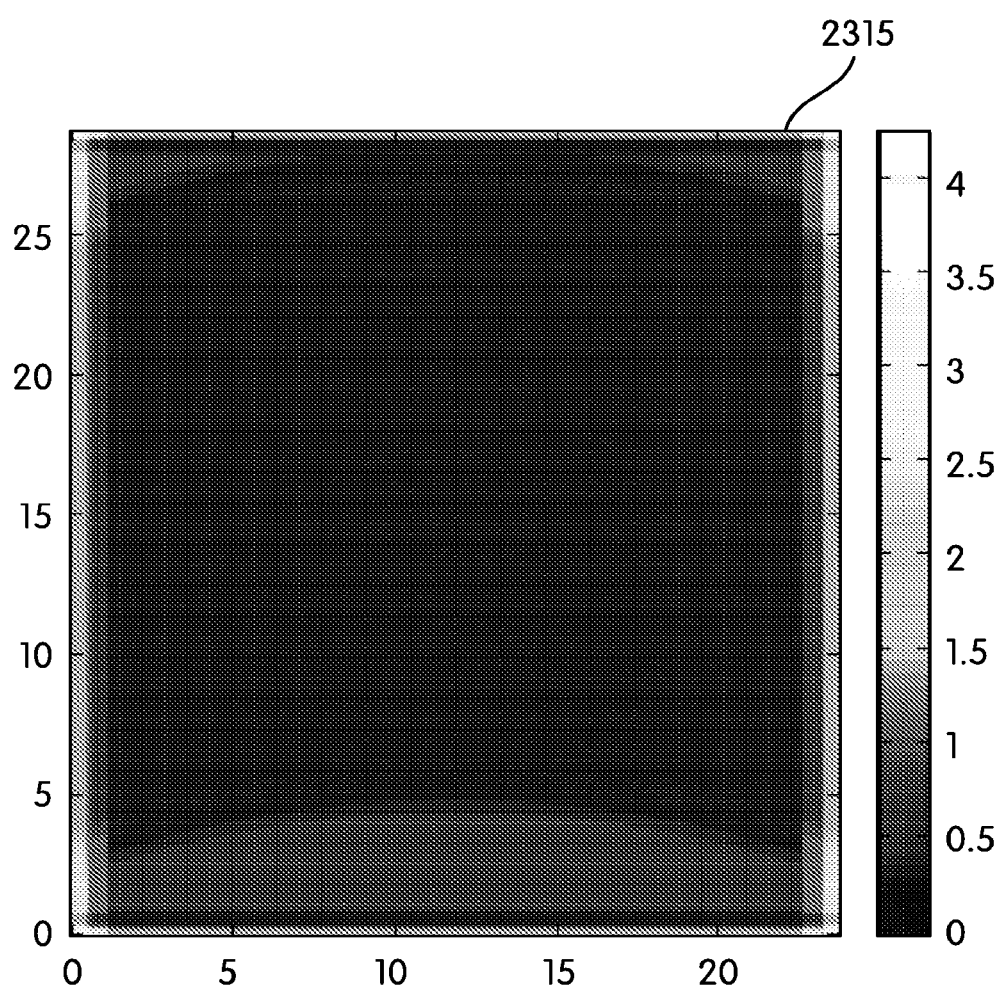

In FIGS. 23A-B, flare maps 2310 and 2315 respectively show EUV and DUV flare contours due to various system-specific flare effects. The respective intensity bars indicate relative intensity values in arbitrary units.

Figure 24A:
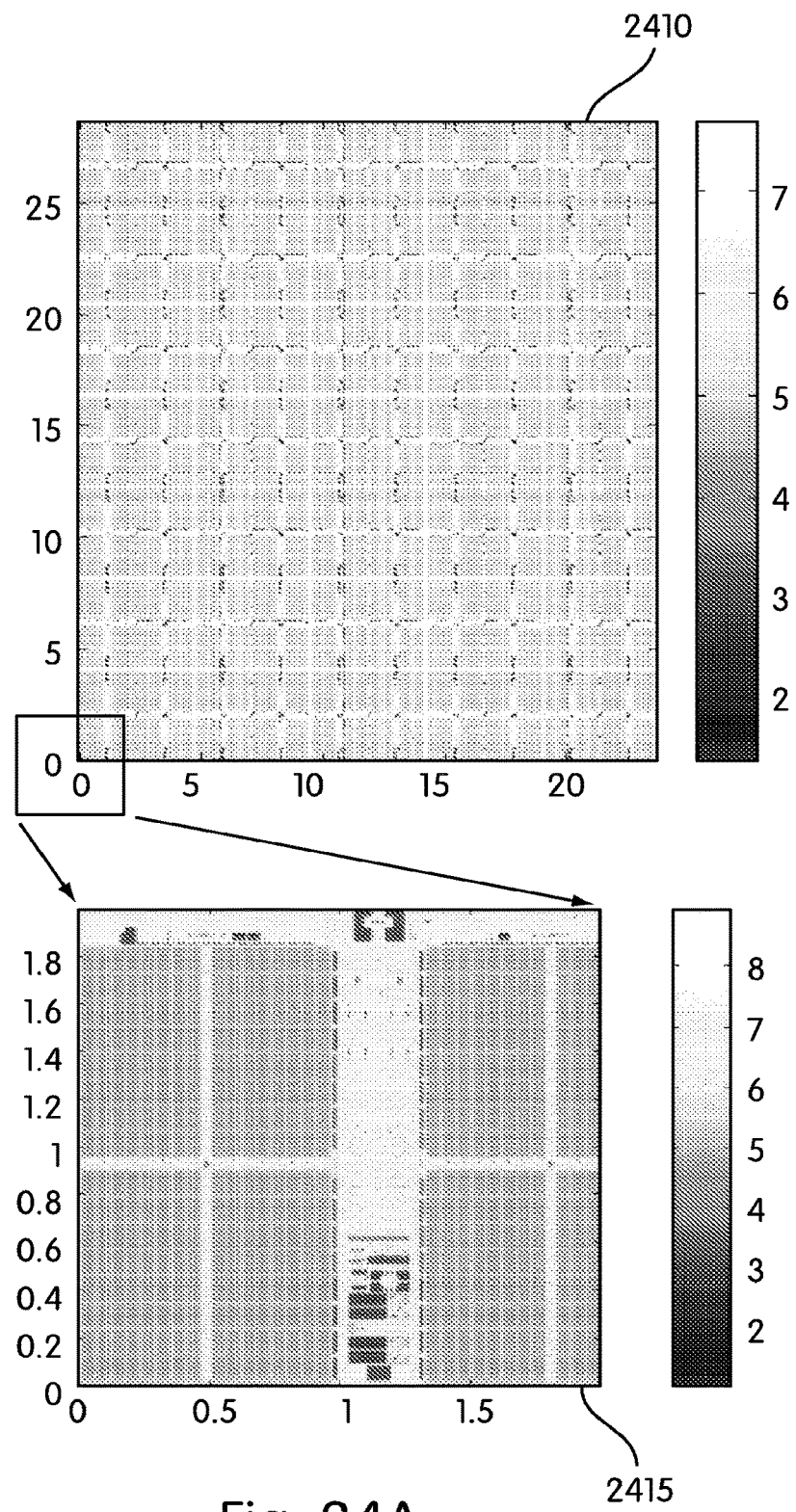
Figure 24B:
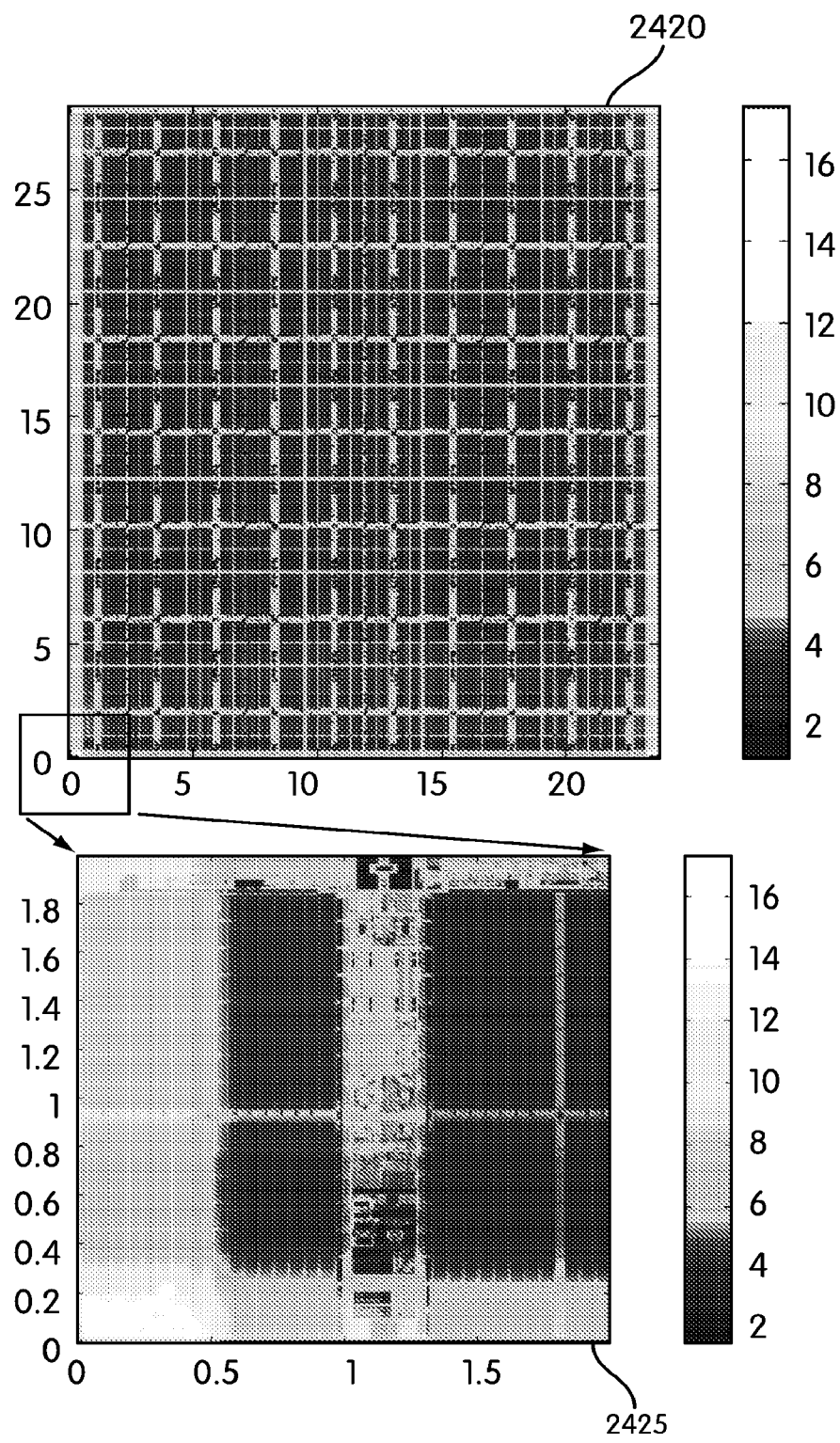

FIG. 24A shows a flare map 2410 with isotropic PSF within an exposure field, with the corner region flare distribution 2415 magnified. Flare map 2420 in FIG. 24B and the magnified flare distribution 2425 in the corner region show how the flare map varies when an anisotropic PSF is assumed in the simulation.

Figure 25:
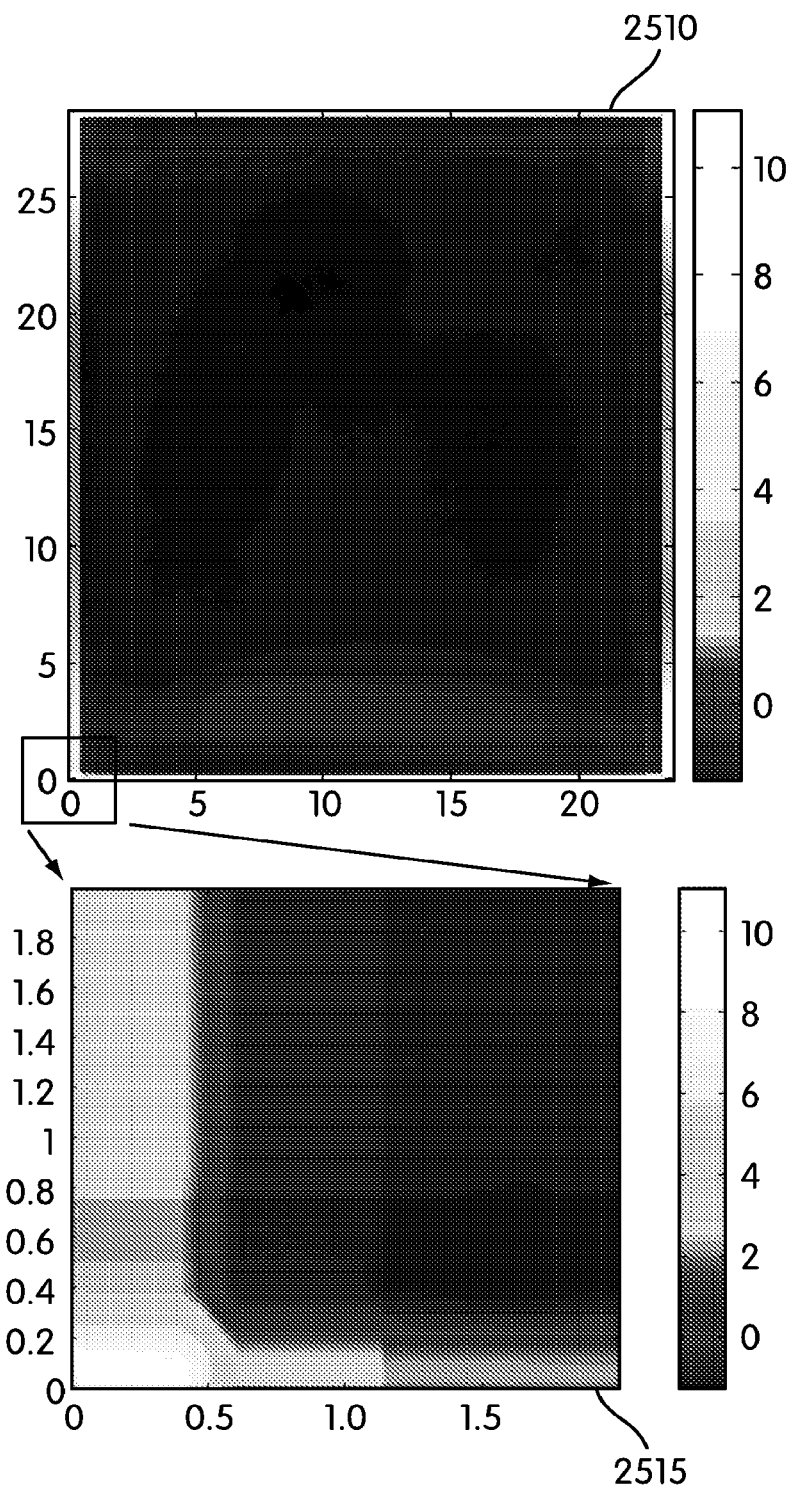

FIG. 25 shows the full field flare difference contour plot 2510 (i.e. difference between flare maps 2410 and 2420), with the corner region flare distribution 2515 magnified for better visualization of intensity contours.

Figure 26:
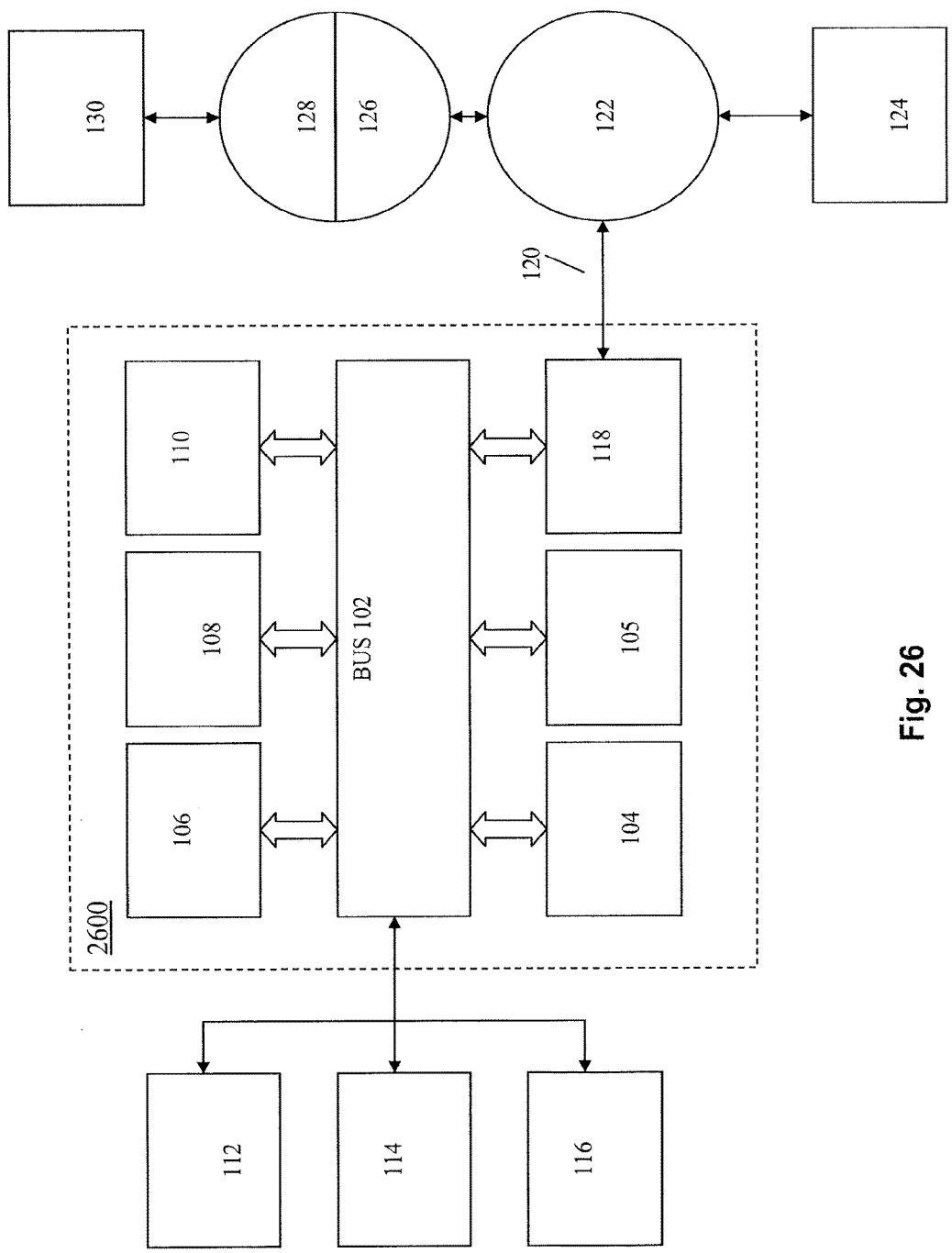
FIG. 26 is a block diagram that illustrates a computer system which can assist in the implementation of the simulation method of the present invention.

6. Details of a Computer System for Implementing the Embodiments of the Present Invention FIG. 26 is a block diagram that illustrates a computer system 2600 which can assist in implementing the correction methods and flows disclosed herein. Computer system 2600 includes a bus 102 or other communication mechanism for communicating information, and a processor 104 coupled with bus 102 for processing information. Computer system 2600 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 2600 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 2600 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, portions of the correction process may be performed by computer system 2600 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 2600 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 2600 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 2600, are exemplary forms of carrier waves transporting the information.

Computer system 2600 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the illumination optimization of the embodiment, for example. The received code may be executed by processor 104 as it is received, and/or stored in storage device 110, or other non-volatile storage for later execution. In this manner, computer system 2600 may obtain application code in the form of a carrier wave.

The invention may further be described using the following clauses:

1. A method for reducing an effect of flare produced by a lithographic system for imaging a design layout onto a substrate, the method comprising:
   simulating a flare map in an exposure field of the lithographic system by mathematically combining a density map of the design layout at the exposure field with a point spread function (PSF), wherein system-specific effects on the flare map are incorporated in the simulation; and calculating location-dependent flare corrections for the design layout by using the determined flare map, thereby reducing the effect of flare.
2. The method of clause 1, wherein the method further comprises:
   applying a predetermined reference value of flare uniformly in the exposure field to modify the design layout.
3. The method of clause 1, wherein the method further includes:
   manufacturing a reticle whose layout has been corrected for the effects of one or more of optical and mask proximity effects, flare and shadowing.
4. A device manufacturing method, wherein a mask is manufactured with a design layout modified such that it reduces an effect of flare produced by a lithographic system in accordance to clause 1.
5. A method for reducing an effect of flare produced by lithographic system for imaging a design layout onto a substrate, the method comprising:
   simulating a flare map in an exposure field of the lithographic system by mathematically combining a density map of the design layout at the exposure field with a point spread function (PSF), wherein system-specific effects on the flare map due to reflection of one or both of extreme ultra violet (EUV) radiation and deep-ultra-violet (DUV) radiation are incorporated in the simulation; and
   calculating location-dependent flare corrections for the design layout by using the determined flare map, thereby reducing the effect of flare.
6. A method for reducing an effect of flare produced by a lithographic system for imaging a design layout onto a substrate, the method comprising:
   determining a flare map in an exposure field of the lithographic system by mathematically combining a density map of the design layout at the exposure field with a point spread function (PSF), wherein the density map comprises a representation of the design layout after being modified by optical enhancement features (OEF); and
   calculating location-dependent flare corrections for the post-OEF design layout by using the determined flare map, thereby reducing the effect of flare.
7. The method of clause 6, wherein the determination of the flare map incorporates one or more of the following system-specific effects: a flare effect due to reflection from black border of a mask, a flare effect due to reflection from one or more reticle-masking blades defining an exposure slit, a flare effect due to overscan, a flare effect due to reflections from a gas-lock sub-aperture of the DGL mechanism, and a flare effect within a specific exposure field due to contribution from other neighbouring exposure fields.
8. The method of clause 6, wherein the PSF is anisotropic to simulate one or more of the following effects: a flare effect due to reflection from black border of a mask, a flare effect due to reflection from one or more reticle-masking blades defining an exposure slit, a flare effect due to reflections from a gas-lock sub-aperture of the DGL mechanism, and a flare effect within a specific exposure field due to contribution from other neighbouring exposure fields.
9. A method for reducing an effect of flare produced by a lithographic system for imaging a design layout onto a substrate, the method comprising:
   simulating a flare map in an exposure field of the lithographic apparatus by mathematically combining a density map of the design layout at the exposure field with a point spread function (PSF), wherein the density map comprises a representation of the design layout after being modified by known flare correction parameters; and
   calculating location-dependent flare corrections for the design layout by using the determined flare map, thereby reducing the effect of flare.
10. The method of clause 9, wherein the density map comprises a representation of the design layout after being modified by optical enhancement features (OEF).

11. The method of clause 10, wherein flare corrections are calculated for the post-OEF design layout.

12. The method of clause 9, wherein the known flare correction parameters include one or more of: simulation-based OEF, known feature bias to overcome mask topology effects, and corrections corresponding to a known reference flare value.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made to the invention as described without departing from the scope of the claims set out below.

The invention claimed is:

1. A method for reducing an effect of flare produced by a lithographic system when imaging a pattern onto a substrate, the method comprising:
   simulating, by a hardware computer, a flare map in an exposure field of the lithographic system by mathematically combining a density map of a pattern at the exposure field with a point spread function (PSF), wherein the PSF is anisotropic in two orthogonal directions and the anisotropy of the PSF further varies from one location in the exposure field to another location in the exposure field; and
   producing electronic data based on the flare map to enable a correction of one or more features in the pattern,
   where the electronic data, or information derived therefrom, is for configuring the lithographic system, for configuring a manufacturing process involving the lithographic system, for configuring a patterning device to be used in the lithographic system, and/or for configuring manufacture of a patterning device to be used in the lithographic system.

2. The method of claim 1, further comprising performing a first level flare correction on a layout of at least part of the pattern, wherein the density map is based on the corrected layout.

3. The method of claim 2, wherein performing the first level flare correction includes using a reference flare correction and an optical enhancement features (OEF) output for the pattern.

4. The method of claim 3, further comprising:
   updating a post-OEF layout with a location-dependent flare correction to create an improved post-OEF flare-corrected layout; and
   using the improved post-OEF flare-corrected layout to improve an accuracy of a computational lithography model for the lithographic system.

5. The method of claim 1, further comprising obtaining a location database having information about a location of each pattern of a plurality of patterns within the exposure field, wherein the density map is created using the location database.

6. The method of claim 1, further comprising, before mathematically combining the density map with the PSF, adjusting the PSF to account for a system-specific effect on flare due to an identified characteristic of the lithographic system, such that the system-specific effect on the flare map is incorporated in the simulation.

7. The method of claim 6, wherein the system-specific effect includes one or more selected from: a flare effect due to reflection from a black border of a mask, a flare effect due to reflection from one or more reticle-masking blades defining an exposure slit, a flare effect due to overscan, a flare effect due to a reflection from a gas-lock sub-aperture of a dynamic gas lock (DGL) mechanism, and/or a flare effect within a specific exposure field due to contribution from an other neighbouring exposure field.

8. The method of claim 6, wherein the adjusted PSF is expressed in a fractal form in the frequency domain, or in a tabulated form in the spatial domain, relating PSF values with corresponding discrete distances.

9. The method of claim 1, further comprising calculating a location-dependent flare correction for the pattern by using the determined flare map, thereby reducing the effect of flare.

10. The method of claim 9, wherein the calculating the location-dependent correction comprises:
    creating a reference image of the pattern with a zero-flare or a known reference-flare condition; and
    comparing the determined flare map with the reference image to calculate the location-dependent flare correction.

11. The method of claim 10, wherein the reference image is an aerial image or a density map of the pattern at the exposure field using a relatively fine grid.

12. The method of claim 1, wherein a direction of anisotropy of the PSF varies according to one or more selected from: a flare effect due to a reflection from black border of a mask, a flare effect due to reflection from one or more reticle-masking blades defining an exposure slit, a flare effect due to overscan, a flare effect due to a reflection from a gas-lock sub-aperture of a dynamic gas lock (DGL) mechanism, and/or a flare effect within a specific exposure field due to contribution from an other neighbouring exposure field.

13. The method of claim 1, further comprising using a relatively coarse grid to approximate the density map at the exposure field to determine the flare map.

14. The method of claim 1, wherein the imaging involves imaging the pattern using a radiation beam in the lithographic system that has an extreme ultra-violet (EUV) wavelength and the radiation beam is projected using reflective optics.

15. The method of claim 1, further comprising compensating for shadowing effects at the exposure field.

16. The method of claim 15, further comprising calculating and applying a mask proximity correction (MPC) to a design layout after an optical enhancement features (OEF), flare and shadow correction.

17. The method of claim 1, wherein the pattern comprises a repetition of another pattern and the other pattern consists essentially of a single chip.

18. The method of claim 1, wherein within the exposure field, a direction in which the PSF anisotropically varies changes from one location in the exposure field to another location of the exposure field, such that in a first location of the exposure field, the PSF varies anisotropically in a first direction and, in a second location of the exposure field, the PSF varies anisotropically in a second direction different from the first direction.

19. The method of claim 1, wherein a tail portion of the PSF is approximated with a substantially fixed flare level dependent, at least in part, on a saturated pattern density.

20. The method of claim 1, further comprising generating one or more files corresponding to a modified pattern, wherein the modified pattern is the pattern modified, based on the electronic data, such that it reduces an effect of flare.

21. A computer program product comprising a non-transitory computer-readable medium having instructions recorded therein, the instructions, when executed by a computer system, configured to cause the computer system to at least:

simulate a flare map in an exposure field of a lithographic system by mathematically combining a density map of a pattern at the exposure field with a point spread function (PSF), wherein the PSF is anisotropic in two orthogonal directions and the anisotropy of the PSF further varies from one location in the exposure field to another location in the exposure field; and produce electronic data based on the flare map to enable a correction of one or more features in the pattern, where the electronic data, or information derived therefrom, is for configuring the lithographic system, for configuring a manufacturing process involving the lithographic system, for configuring a patterning device to be used in the lithographic system, and/or for configuring manufacture of a patterning device to be used in the lithographic system.

22. The computer program product of claim 21, wherein the instructions are further configured to cause the computer system to generate one or more files corresponding to a modified pattern, wherein the modified pattern is the pattern modified, based on the electronic data, such that it reduces an effect of flare.

23. The computer program product of claim 21, wherein within the exposure field, a direction in which the PSF anisotropically varies changes from one location in the exposure field to another location of the exposure field, such that in a first location of the exposure field, the PSF varies anisotropically in a first direction and, in a second location of the exposure field, the PSF varies anisotropically in a second direction different from the first direction.

24. A non-transitory computer-readable medium having instructions recorded therein, the instructions, when executed by a computer system, are configured to cause the computer system to at least:

simulate a flare map in an exposure field of a lithographic system by mathematically combining a density map, for at an exposure field, of a pattern for imaging by a lithographic system onto a substrate with a point spread function (PSF), wherein the PSF is anisotropic in two orthogonal directions across the exposure field and the anisotropy has a generally elliptical shape in a plane defined by the two orthogonal directions; and produce electronic data based on the flare map to enable a correction of one or more features in the pattern, where the electronic data, or information derived therefrom, is for configuring the lithographic system, for configuring a manufacturing process involving the lithographic system, for configuring a patterning device to be used in the lithographic system, and/or for configuring manufacture of a patterning device to be used in the lithographic system.

* * * * *